US012699490B2

(12) United States Patent
Ko et al.

(10) Patent No.: US 12,699,490 B2
(45) Date of Patent: Aug. 4, 2026

(54) ELECTRONIC DEVICE INCLUDING DUMMY CONTACT HOLE

(71) Applicant: SAMSUNG DISPLAY CO., LTD., Yongin-si (KR)

(72) Inventors: Gyung-Min Ko, Yongin-si (KR); Yong-Hwan Park, Yongin-si (KR); Seongjun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/911,683

(22) Filed: Oct. 10, 2024

(65) Prior Publication Data

US 2025/0130677 A1     Apr. 24, 2025

(30) Foreign Application Priority Data

Oct. 23, 2023     (KR) ......................... 10-2023-0142323

(51) Int. Cl.
G06F 3/044        (2006.01)
H10K 59/40        (2023.01)

(52) U.S. Cl.
CPC .......... G06F 3/0446 (2019.05); G06F 3/0443 (2019.05); H10K 59/40 (2023.02); *G06F 2203/04107* (2013.01); *G06F 2203/04111* (2013.01); *G06F 2203/04112* (2013.01)

(58) Field of Classification Search
CPC . G06F 3/044–0448; G06F 2203/04107; G06F 2203/04111; G06F 2203/04112
See application file for complete search history.

(56) References Cited

U.S. PATENT DOCUMENTS 9,400,580 B2 *   7/2016  Lim ....................... G06F 3/0446
9,715,304 B2 *   7/2017  Berget ................. G06F 3/0412
9,817,529 B2 *  11/2017  Bae ....................... G06F 3/0443
9,898,134 B2 *   2/2018  Wang ................. G06F 3/04164
(Continued)

FOREIGN PATENT DOCUMENTS

KR      10-2018-0125914 A     11/2018
KR         10-1929281 B1      3/2019
(Continued)

OTHER PUBLICATIONS

Search Report dated Dec. 27, 2024, in corresponding WO Patent Application No. (PCT/KR2024/014410), 11 pages.

*Primary Examiner* — Patrick F Marinelli
(74) *Attorney, Agent, or Firm* — F. CHAU & ASSOCIATES, LLC

(57)     ABSTRACT

An electronic device includes a display layer and a sensor layer disposed on the display layer. The sensor layer includes a first electrode, a second electrode including a sensing pattern and a bridge pattern, and a dummy pattern disposed on the same layer as the bridge pattern and spaced apart from the bridge pattern. A plurality of contact holes is defined through the sensing layer, the plurality of contact holes include an effective contact hole through which a portion of the bridge pattern is exposed and a dummy contact hole through which a portion of the dummy pattern is exposed. The sensing pattern is electrically connected to the bridge pattern via the effective contact hole, and the first electrode or the sensing pattern is connected to the dummy pattern via the dummy contact hole.

30 Claims, 15 Drawing Sheets

(56)                References Cited

U.S. PATENT DOCUMENTS

| | | | | |
|---|---|---|---|---|
| 10,620,732 | B2 | 4/2020 | Oh et al. | |
| 10,656,742 | B2 * | 5/2020 | Kim | G06F 3/0443 |
| 10,782,834 | B2 * | 9/2020 | Chen | G06F 3/0446 |
| 10,852,865 | B2 * | 12/2020 | Kim | G06F 3/044 |
| 10,871,866 | B2 * | 12/2020 | Kang | G06F 3/0446 |
| 11,079,890 | B2 * | 8/2021 | Jeong | G06F 3/0446 |
| 11,157,119 | B2 * | 10/2021 | Lee | G06F 3/0444 |
| 11,402,935 | B2 * | 8/2022 | Lee | G06F 1/1652 |
| 11,526,244 | B2 * | 12/2022 | Lee | G06F 3/0443 |
| 11,604,524 | B2 * | 3/2023 | Kim | G06F 3/0443 |
| 11,656,705 | B2 | 5/2023 | Jeong et al. | |
| 11,675,451 | B2 * | 6/2023 | Koide | G06F 3/044 |
| | | | | 345/174 |
| 11,740,718 | B2 * | 8/2023 | Choi | G04G 17/00 |
| | | | | 345/173 |
| 11,762,489 | B2 * | 9/2023 | Guo | G06F 3/0412 |
| | | | | 345/174 |
| 11,782,546 | B2 * | 10/2023 | Koide | G06F 3/0412 |
| | | | | 345/174 |
| 12,008,192 | B2 * | 6/2024 | Ye | G09G 3/006 |
| 12,061,758 | B2 * | 8/2024 | Koide | G06F 3/0443 |
| 12,248,650 | B2 * | 3/2025 | Zhang | G06F 3/0448 |
| 12,288,508 | B2 * | 4/2025 | Ikeda | G06V 40/1306 |
| 12,314,505 | B2 * | 5/2025 | Koide | G06F 3/0412 |
| 12,449,929 | B2 * | 10/2025 | Lin | G06F 3/0446 |
| 12,455,665 | B2 * | 10/2025 | Jeong | G06F 3/0412 |
| 12,541,261 | B2 * | 2/2026 | Bok | G06F 3/0412 |
| 12,554,349 | B2 * | 2/2026 | Wang | G06F 3/0412 |
| 2009/0085885 | A1 * | 4/2009 | Wu | G06F 3/0443 |
| | | | | 345/173 |
| 2011/0141037 | A1 * | 6/2011 | Hwang | G06F 3/0446 |
| | | | | 345/173 |
| 2013/0328830 | A1 * | 12/2013 | Han | G06F 3/0448 |
| | | | | 345/174 |
| 2014/0118292 | A1 * | 5/2014 | Kim | G06F 3/0443 |
| | | | | 216/13 |
| 2014/0168109 | A1 * | 6/2014 | Kang | G06F 3/0448 |
| | | | | 345/173 |
| 2015/0220191 | A1 * | 8/2015 | Huh | G06F 3/0443 |
| | | | | 345/173 |
| 2016/0048248 | A1 * | 2/2016 | Na | G06F 3/047 |
| | | | | 345/174 |
| 2016/0077629 | A1 * | 3/2016 | Ono | G06F 3/0445 |
| | | | | 345/174 |
| 2016/0202827 | A1 * | 7/2016 | Bae | G06F 3/0443 |
| | | | | 345/174 |

| | | | | |
|---|---|---|---|---|
| 2016/0378254 | A1 * | 12/2016 | Wang | G06F 3/0443 |
| | | | | 345/174 |
| 2017/0003791 | A1 * | 1/2017 | Berget | G06F 3/0412 |
| 2017/0090635 | A1 * | 3/2017 | Kim | G06F 3/044 |
| 2017/0353181 | A1 * | 12/2017 | Kim | G06F 3/0416 |
| 2018/0113535 | A1 * | 4/2018 | Kang | G06F 3/0446 |
| 2018/0224984 | A1 * | 8/2018 | Kim | G06F 3/0443 |
| 2019/0302921 | A1 * | 10/2019 | Chen | G06F 3/044 |
| 2019/0363297 | A1 * | 11/2019 | Park | H10K 59/40 |
| 2020/0026380 | A1 * | 1/2020 | Zeng | G06F 3/04164 |
| 2020/0174608 | A1 * | 6/2020 | Lee | G06F 1/1626 |
| 2020/0293148 | A1 * | 9/2020 | Chen | G06F 3/0446 |
| 2020/0293150 | A1 * | 9/2020 | Jeong | G06F 3/0443 |
| 2021/0048925 | A1 * | 2/2021 | Wang | G06F 3/0446 |
| 2021/0117043 | A1 * | 4/2021 | Lee | G06F 3/044 |
| 2021/0132737 | A1 * | 5/2021 | Lee | G06F 3/0444 |
| 2021/0333943 | A1 * | 10/2021 | Li | G06F 3/044 |
| 2022/0019306 | A1 * | 1/2022 | Koide | G02F 1/136286 |
| 2022/0197420 | A1 * | 6/2022 | Choi | G04G 17/02 |
| 2022/0334678 | A1 | 10/2022 | Long | |
| 2023/0037791 | A1 * | 2/2023 | Koide | G06F 3/04164 |
| 2023/0118501 | A1 * | 4/2023 | Guo | G06F 3/0443 |
| | | | | 345/174 |
| 2023/0236694 | A1 * | 7/2023 | Lin | G06F 3/0445 |
| | | | | 345/173 |
| 2023/0400941 | A1 * | 12/2023 | Koide | G06F 3/0412 |
| 2024/0045533 | A1 * | 2/2024 | Miyamoto | G09G 3/3225 |
| 2024/0111378 | A1 * | 4/2024 | Ye | G09G 3/006 |
| 2024/0353943 | A1 * | 10/2024 | Koide | G06F 3/0443 |
| 2024/0370127 | A1 * | 11/2024 | Jiang | G06F 3/0446 |
| 2024/0402841 | A1 * | 12/2024 | Zhang | G06F 3/0412 |
| 2025/0053266 | A1 * | 2/2025 | Park | G06F 3/0416 |
| 2025/0053267 | A1 * | 2/2025 | Jeong | G06F 3/0443 |
| 2025/0130677 | A1 * | 4/2025 | Ko | G06F 3/0446 |
| 2025/0173010 | A1 * | 5/2025 | Bok | G06F 3/0412 |
| 2025/0231632 | A1 * | 7/2025 | Wang | G06F 3/0412 |
| 2025/0383746 | A1 * | 12/2025 | Yoo | G06F 3/0412 |

FOREIGN PATENT DOCUMENTS

| | | | | |
|---|---|---|---|---|
| KR | 10-2020-0110569 | A | | 9/2020 |
| KR | 10-2021-0052895 | A | | 5/2021 |
| KR | 10-2021-0054847 | A | | 5/2021 |
| KR | 20210054847 | A | * | 5/2021 |
| KR | 10-2021-0105467 | A | | 8/2021 |
| KR | 10-2022-0089770 | A | | 6/2022 |
| KR | 10-2023-0074103 | A | | 5/2023 |

* cited by examiner

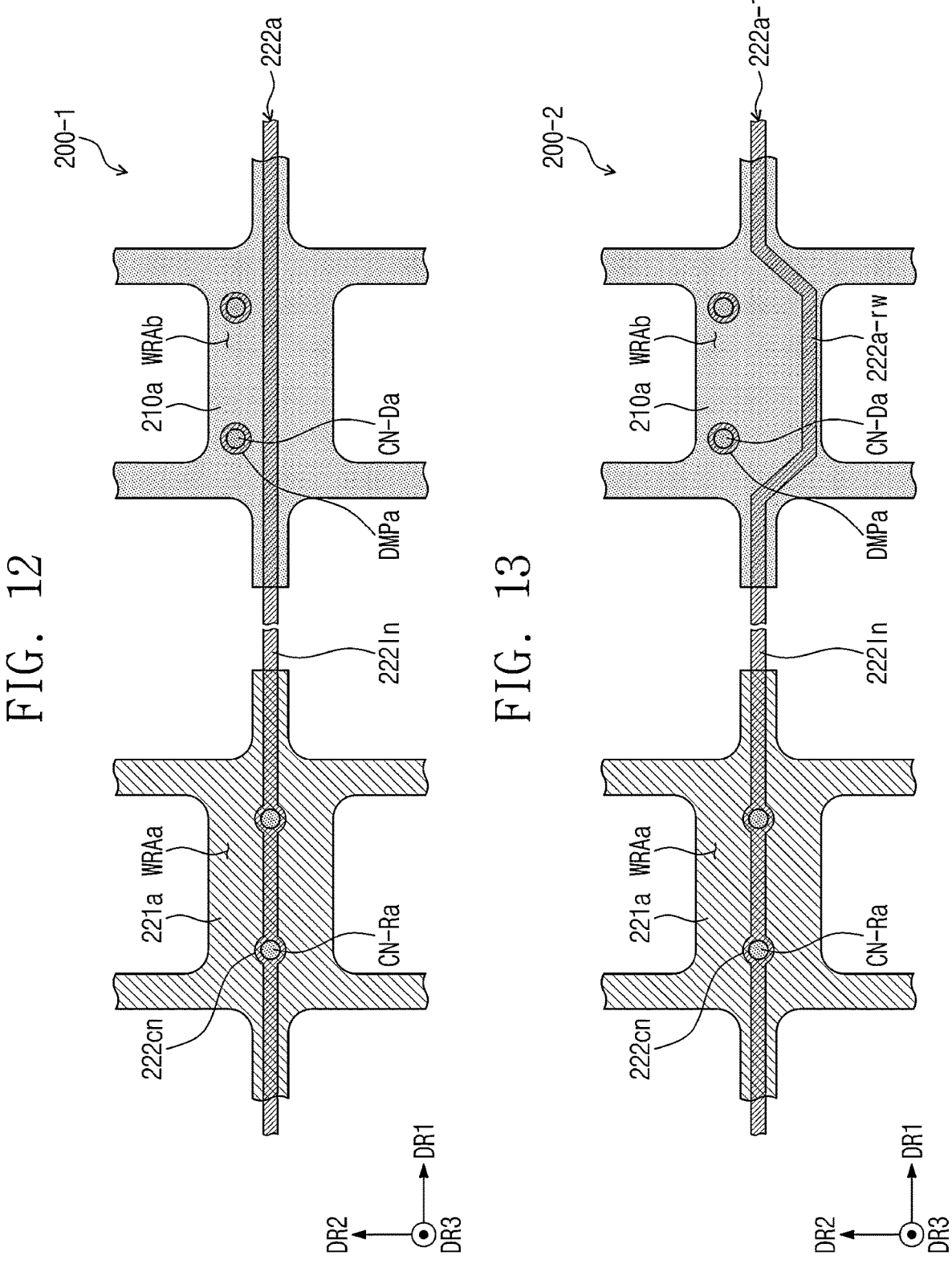

Figures 14, 15:
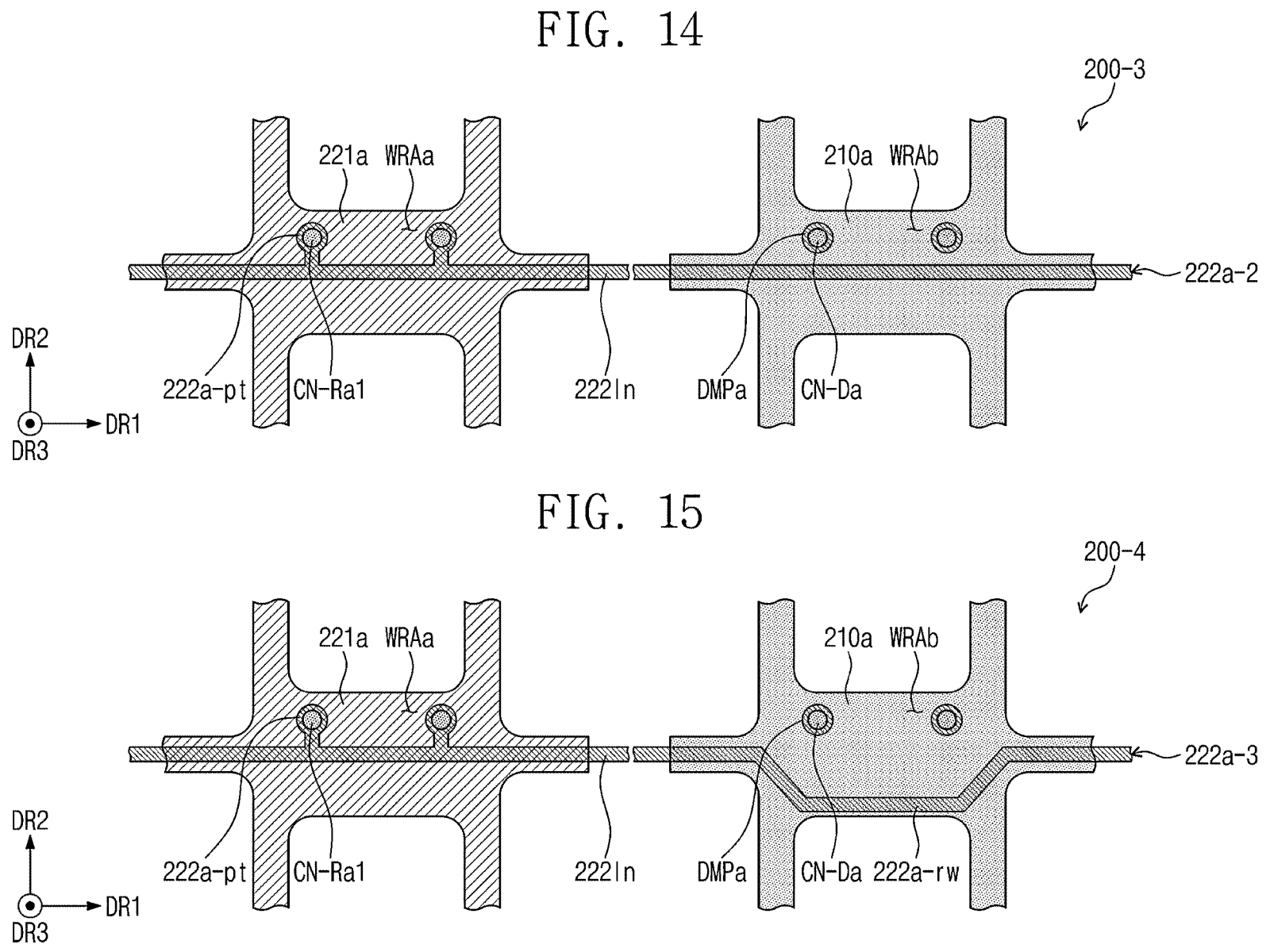

210a  WRAb

221a  WRAa

CN-Da

DMPa

210a  WRAb

221a  WRAa

CN-Da  222a-rw

DMPa

222In

CN-Ra1

222a-pt

DR2
DR1
DR3

200-6

221b2

CN-Rb2

222dm2 CN-Dm3

DMP3a

CN-Dm5

WRA

DMP1a CN-Dm3

CN-Dm3

222b

DMP2a CN-Dm2 222dm1 210a CN-Dm1

222dm1

CN-Rb1

CN-Dm4

222dm3

221b1

CN-Dm4

DR1

DR2

DR3

ELECTRONIC DEVICE INCLUDING DUMMY CONTACT HOLE

CROSS-REFERENCE TO RELATED APPLICATIONS

This application claims priority under 35 U.S.C. § 119 to Korean Patent Application No. 10-2023-0142323, filed on Oct. 23, 2023 in the Korean Intellectual Property Office, the disclosure of which is incorporated by reference herein in its entirety.

TECHNICAL FIELD

The present disclosure relates to an electronic device and, more specifically, to an electronic device including a dummy contact hole.

DISCUSSION OF THE RELATED ART

Multimedia electronic devices, such as televisions, mobile phones, tablet computers, navigation units, portable game consoles, and car displays, display images and provide a touch-based input method that allows users to easily and intuitively input information or commands in addition to the usual input methods, such as a button, a keyboard, a mouse, etc. Many of these electronic devices make use of conductive patterns to sense touch events. These conductive patterns may have a tendency to reflect external light, and the reflected light may be perceived by the user.

SUMMARY

An electronic device includes a display layer configured to display an image and a sensor layer disposed on the display layer. The sensor layer includes a first electrode, a second electrode intersecting the first electrode and including a sensing pattern and a bridge pattern, an insulating layer disposed between the sensing pattern and the bridge pattern, and a dummy pattern disposed on a same layer as the bridge pattern and spaced apart from the bridge pattern. A plurality of contact holes is defined through the insulating layer, the plurality of contact holes include an effective contact hole through which a portion of the bridge pattern is exposed and a dummy contact hole through which a portion of the dummy pattern is exposed, the sensing pattern is electrically connected to the bridge pattern via the effective contact hole, and the first electrode or the sensing pattern is connected to the dummy pattern via the dummy contact hole.

The first electrode may include a first mesh line extending in a first direction and a second mesh line extending in a second direction intersecting the first direction, and the sensing pattern may include a third mesh line extending in the first direction and a fourth mesh line extending in the second direction.

The dummy contact hole may be provided in plural, the plurality of dummy contact holes may be defined at a first cross-point where the first mesh line intersects or meets with the second mesh line and a second cross-point where the third mesh line intersects or meets with the fourth mesh line, and the effective contact hole may overlap the bridge pattern, where the third mesh line intersects or meets with the fourth mesh line.

The first electrode may further include a first non-opening area having a width that is greater than a width of the first mesh line, and the sensing pattern may further include a second non-opening area having a width that is greater than a width of the third mesh line.

The effective contact hole may overlap the second non-opening area.

The dummy contact hole may be provided in plural, the plurality of dummy contact holes may overlap the first non-opening area.

The dummy contact hole may be provided in plural, the plurality of dummy contact holes may be defined at a first cross-point where the first mesh line intersects or meets the second mesh line, a second cross-point where the third mesh line intersects or meets the fourth mesh line, and the first non-opening area.

The display layer may include a plurality of first light emitting areas, a plurality of second light emitting areas, and a plurality of third-light emitting areas. The plurality of first light emitting areas may be alternately arranged with the plurality of second light emitting areas in the second direction. The plurality of third-light emitting areas may be arranged in the second direction, and one third-light emitting area, among the plurality of third-light emitting areas, may be spaced apart from one first light emitting area, among the plurality of first light emitting areas, and one second light emitting area, among the plurality of second light emitting areas, in the first direction.

The effective contact hole may be defined between two third-light emitting areas adjacent to each other in the second direction, among the plurality of third-light emitting areas, and the bridge pattern may overlap an area between the two third-light emitting areas.

The dummy contact hole may be defined between another two third-light emitting areas adjacent to each other in the second direction among the plurality of third-light emitting areas, and the dummy pattern may overlap an area between the other two third-light emitting areas.

The bridge pattern may extend in a first direction, and the dummy pattern may be spaced apart from the bridge pattern in a second direction intersecting the first direction.

The bridge pattern may include a curved portion facing the dummy pattern and curved to bypass the dummy pattern.

The effective contact hole may be spaced apart from the dummy contact hole in the first direction, and the effective contact hole and the dummy contact hole may be aligned with each other.

The bridge pattern may include a line portion extending in a first direction, and the dummy contact hole may be spaced apart from the bridge pattern in a second direction intersecting the first direction.

The bridge pattern may further include a curved portion extending from the line portion, and the dummy contact hole may be spaced apart from the curved portion in the second direction.

The bridge pattern may further include a connection portion connected to the line portion, and the effective contact hole may overlap the connection portion.

The bridge pattern may further include a protrusion portion protruded in the second direction, and the effective contact hole may overlap the protrusion portion.

The sensor layer may further include a plurality of dummy bridge patterns disposed on the same layer as the bridge pattern and spaced apart from the bridge pattern.

The plurality of dummy bridge patterns may include a first dummy bridge pattern overlapping the first electrode and the sensing pattern and electrically floated. A second dummy bridge pattern may overlap the first electrode and may be electrically connected to the first electrode. A third dummy bridge pattern may overlap the sensing pattern and may be electrically connected to the sensing pattern.

An electronic device includes a display layer configured to display an image and a sensor layer disposed on the display layer. The sensor layer includes a first electrode, a second electrode intersecting the first electrode and including a sensing pattern and a bridge pattern, an insulating layer disposed between the sensing pattern and the bridge pattern, and a dummy pattern disposed on the same layer as the bridge pattern and spaced apart from the bridge pattern. A plurality of contact holes is defined through the insulating layer, the plurality of contact holes include an effective contact hole overlapping the bridge pattern and a dummy contact hole that does not overlap the bridge pattern and instead overlaps the dummy pattern. The bridge pattern includes a line portion extending in a first direction. The dummy contact hole is spaced apart from the bridge pattern in a second direction intersecting the first direction.

The bridge pattern may further include a curved portion extending from the line portion, and the dummy contact hole may be spaced apart from the curved portion in the second direction.

The bridge pattern may further include a connection portion connected to the line portion, and the effective contact hole may overlap the connection portion.

The bridge pattern may further include a protrusion portion protruded in the second direction, and the effective contact hole may overlap the protrusion portion.

An electronic device includes a first conductive layer including a bridge pattern and a plurality of dummy patterns, a second conductive layer including a plurality of conductive patterns having a mesh structure, and an insulating layer disposed between the first conductive layer and the second conductive layer and provided with a plurality of effective contact holes and a plurality of dummy contact holes defined therethrough. The plurality of effective contact holes overlap the bridge pattern, and the plurality of dummy contact holes respectively overlap the dummy patterns.

The mesh structure may include a plurality of cross-points, and each of the plurality of cross-points may overlap at least one contact hole, among the plurality of effective contact holes, and the plurality of dummy contact holes.

The mesh structure may include a plurality of mesh lines and a plurality of non-opening areas having a width that is greater than a width of the mesh lines, and each of the non-opening areas may overlap at least one effective contact hole, among the effective contact holes, or at least one dummy contact hole, among the dummy contact holes.

The bridge pattern may include a line portion extending in a first direction, and the plurality of dummy contact holes may be spaced apart from the bridge pattern in a second direction intersecting the first direction.

The bridge pattern may further include a plurality of curved portions extending from the line portion, and the plurality of dummy contact holes may be spaced apart from the plurality of curved portions in the second direction.

The bridge pattern may further include a plurality of connection portions having a width that is greater than a width of the line portion, and the plurality of effective contact holes may overlap the plurality of connection portions, respectively.

The bridge pattern may further include a plurality of protrusion portions protruded in the second direction, and the plurality of effective contact holes may overlap the plurality of protrusion portions.

BRIEF DESCRIPTION OF THE DRAWINGS

The above and other aspects of the present disclosure will become readily apparent by reference to the following detailed description when considered in conjunction with the accompanying drawings, wherein:

FIG. 12 is an enlarged plan view of a portion of a sensor layer according to an embodiment of the present disclosure;

FIG. 13 is an enlarged plan view of a portion of a sensor layer according to an embodiment of the present disclosure;

FIG. 14 is an enlarged plan view of a portion of a sensor layer according to an embodiment of the present disclosure;

FIG. 15 is an enlarged plan view of a portion of a sensor layer according to an embodiment of the present disclosure;

DETAILED DESCRIPTION

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals may refer to like elements throughout the specification and the drawings. While each drawing may represent one or more particular embodiments of the present disclosure, drawn to scale, such that the relative lengths, thicknesses, and angles can be inferred therefrom, it is to be understood that the present invention is not necessarily limited to the relative lengths, thicknesses, and angles shown. Changes to these values may be made within the spirit and scope of the present disclosure, for example, to allow for manufacturing limitations and the like. As used herein, the term "and/or" may include any and all combinations of one or more of the associated listed items.

It will be understood that, although the terms first, second, etc. may be used herein to describe various elements, these elements should not necessarily be limited by these terms. These terms are used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present disclosure will be described with reference to accompanying drawings.

Figure 1:
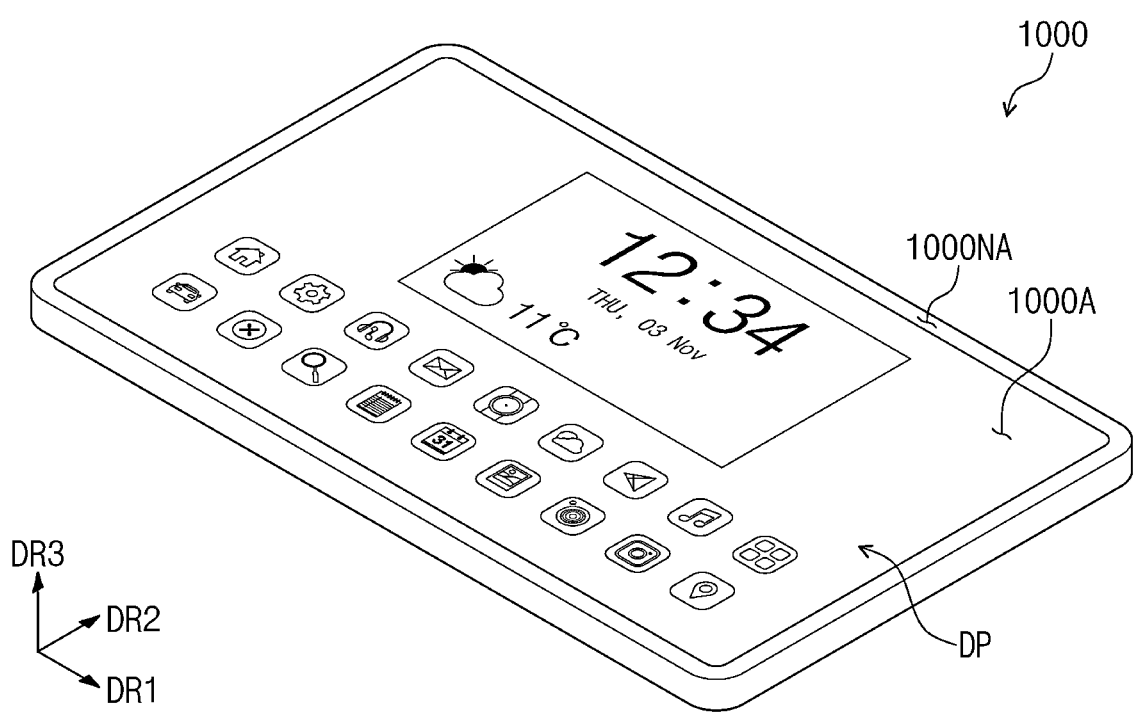
FIG. 1 is a perspective view of an electronic device according to an embodiment of the present disclosure.
Figure 2:
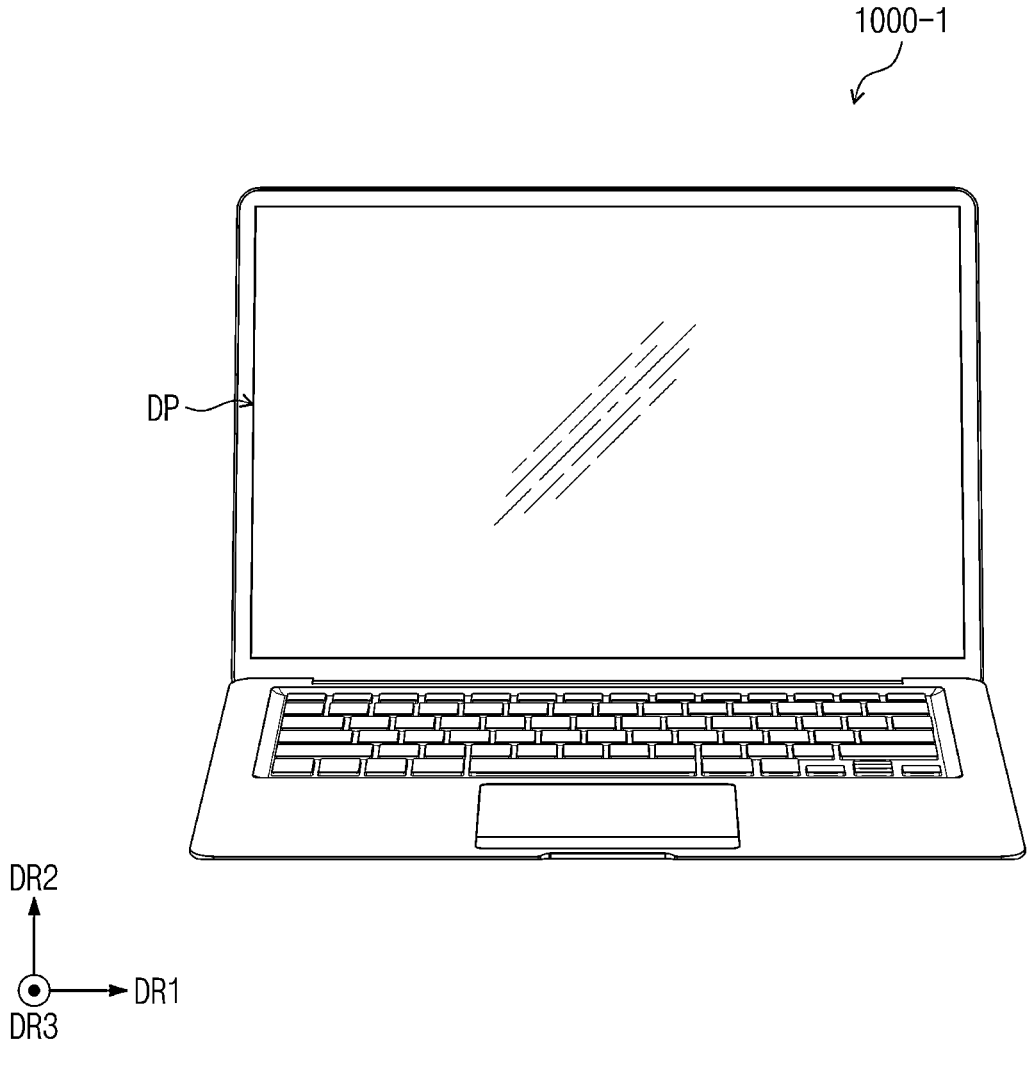
FIG. 2 is a perspective view of an electronic device according to an embodiment of the present disclosure.

FIG. 1 is a perspective view of an electronic device 1000, according to an embodiment of the present disclosure. FIG. 2 is a perspective view of an electronic device 1000-1, according to an embodiment of the present disclosure.

Referring to FIGS. 1 and 2, the electronic device 1000 or 1000-1 may be activated in response to electrical signals. For example, the electronic device 1000 or 1000-1 may be a mobile phone, a foldable mobile phone, a notebook computer, a television, a tablet computer, a car navigation unit, a game console, or a wearable device, however, it should not necessarily be limited thereto or thereby. FIG. 1 shows the tablet computer as a representative example of the electronic device 1000, and FIG. 2 shows the notebook computer as a representative example of the electronic device 1000-1.

The electronic device 1000 may include an active area 1000A and a peripheral area 1000NA, which are provided (defined or formed) therein. The electronic device 1000 may display an image through the active area 1000A. The active area 1000A may include a surface defined by a first direction DR1 and a second direction DR2. The peripheral area 1000NA may at least partially surround the active area 1000A. As used herein, the phrase "at least partially surround" is understood to mean that the surrounding element contacts the surrounded element on at least one side or portion thereof, may contact the surrounded element on two sides, whether those sides are opposite sides or proximate sides, may contact the surrounded element on more than two sides, and may even completely surround the surrounded element. According to an embodiment, the peripheral area 1000NA may be omitted.

A thickness direction of the electronic device 1000 may be measured in a third direction DR3 intersecting the first direction DR1 and the second direction DR2. Accordingly, front (or upper) and rear (or lower) surfaces of each member of the electronic device 1000 may be defined with respect to the third direction DR3.

The electronic device 1000 may include a display panel DP. The display panel DP may display the image and may sense an external input applied thereto. For example, the external input may be the user's input. The user input may include a variety of forms of external inputs, such as a part of user's body, stylus, pen, light, heat, or pressure.

FIG. 1 shows a bar-type electronic device 1000 as a representative example, however, the present disclosure should not necessarily be limited thereto or thereby. As an example, the following descriptions may be applied to various electronic devices, such as a rollable-type electronic device, a slidable-type electronic device, a stretchable-type electronic device, etc.

Figure 3:
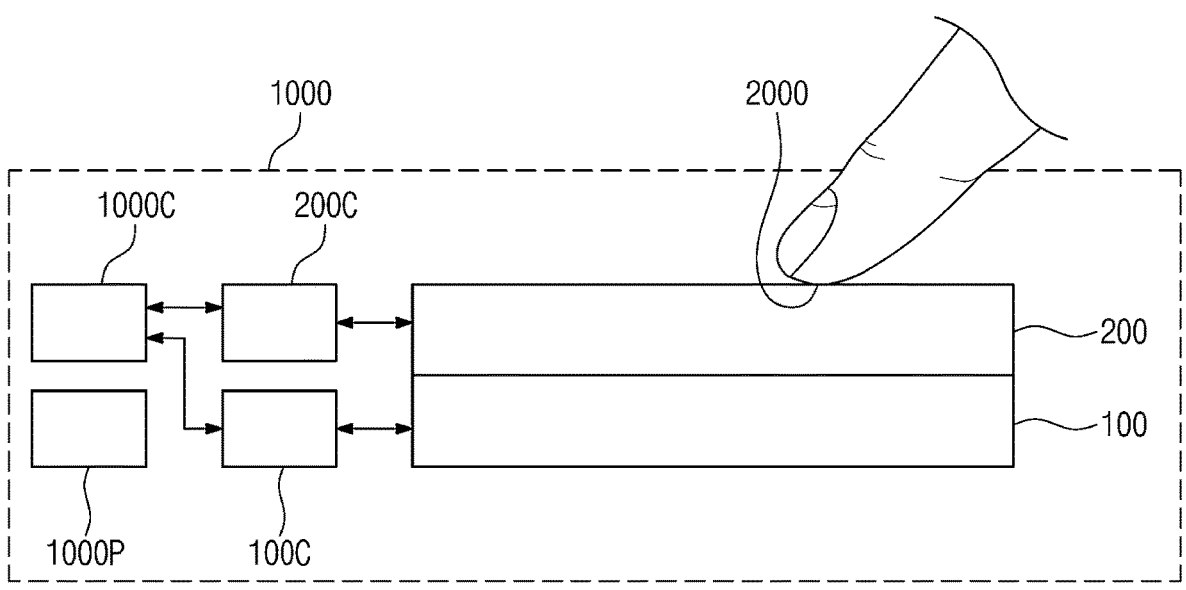
FIG. 3 is a block diagram of an electronic device according to an embodiment of the present disclosure.

FIG. 3 is a block diagram of the electronic device 1000, according to an embodiment of the present disclosure.

Referring to FIG. 3, the electronic device 1000 may include a display layer 100, a sensor layer 200, a display driver 100C, a sensor driver 200C, a main driver 1000C, and a power circuit 1000P.

The display layer 100 may have a configuration that generates the image. The display layer 100 may be a light emitting type display layer. For example, the display layer 100 may be an organic light emitting diode (OLED) display layer, an inorganic light emitting display layer, an organic-inorganic light emitting display layer, a quantum dot display layer, a micro-LED display layer, or a nano-LED display layer.

The sensor layer 200 may be disposed on the display layer 100. The sensor layer 200 may sense an external input applied thereto. The sensor layer 200 may be an integrated sensor formed continuously in a manufacturing process of the display layer 100, or the sensor layer 200 may be an external type sensor attached to the display layer 100.

The main driver 1000C may control an overall operation of the electronic device 1000. For example, the main driver 1000C may control an operation of the display driver 100C and the sensor driver 200C. The main driver 1000C may include at least one microprocessor and may be referred to as a host. The main driver 1000C may further include a graphics controller.

The display driver 100C may drive the display layer 100. The display driver 100C may receive image data and a control signal from the main driver 1000C. The control signal may include a variety of signals. As an example, the control signal may include an input vertical synchronization signal, an input horizontal synchronization signal, a main clock, a data enable signal, or the like.

The sensor driver 200C may drive the sensor layer 200. The sensor driver 200C may receive a control signal from the main driver 1000C. The control signal may include a clock signal of the sensor driver 200C.

The power circuit 1000P may include a power management integrated circuit (PMIC). The power circuit 1000P may generate a plurality of driving voltages to drive the display layer 100, the sensor layer 200, the display driver 100C, and the sensor driver 200C. As an example, the driving voltages may include a gate high voltage, a gate low voltage, an ELVSS voltage, an ELVDD voltage, an initialization voltage, etc., however, the present disclosure should not necessarily be particularly limited thereto.

The electronic device 1000 may sense the external input applied thereto. The electronic device 1000 may sense a passive-type input generated by a touch event 2000. The touch event 2000 may include all input members that cause a change in capacitance, e.g., a user's body and an input device, for example, a pen or stylus.

Figure 4A:
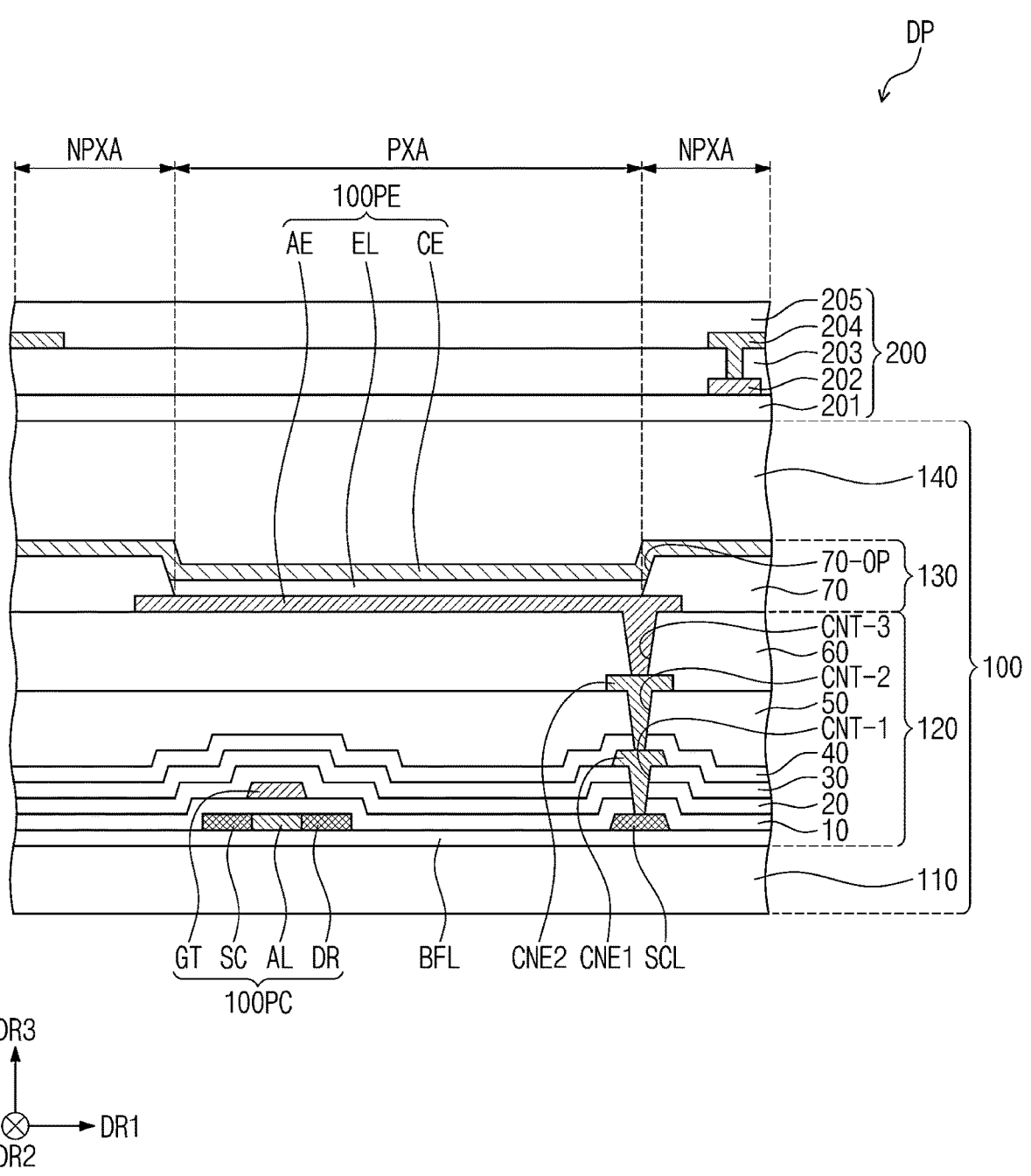
FIG. 4A is a cross-sectional view of a display panel according to an embodiment of the present disclosure.

FIG. 4A is a cross-sectional view of the display panel DP according to an embodiment of the present disclosure.

Referring to FIG. 4A, the display panel DP may include the display layer 100 and the sensor layer 200.

The display layer 100 may have a configuration that generates the image. The display layer 100 may be a light emitting type display layer. For example, the display layer 100 may be an organic light emitting diode (OLED) display layer, an inorganic light emitting display layer, an organic-inorganic light emitting display layer, a quantum dot display layer, a micro-LED display layer, or a nano-LED display layer. The display layer 100 may include a base layer 110, a circuit layer 120, a light emitting element layer 130, and an encapsulation layer 140.

The base layer 110 may be a member that provides a base surface on which the circuit layer 120 is disposed. The base layer 110 may have a single-layer or multi-layer structure. The base layer 110 may be a glass substrate, a metal substrate, a silicon substrate, or a polymer substrate, however, the present disclosure should not necessarily be limited thereto or thereby. The circuit layer 120 may be disposed on the base layer 110. The circuit layer 120 may include an insulating layer, a semiconductor pattern, a conductive pattern, and a signal line. An insulating layer, a semiconductor layer, and a conductive layer may be formed on the base layer 110 by a coating or depositing process. Then, the insulating layer, the semiconductor layer, and the conductive layer may be selectively patterned through several photolithography processes.

The light emitting element layer 130 may be disposed on the circuit layer 120. The light emitting element layer 130 may include a light emitting element. For example, the light emitting element layer 130 may include an organic light emitting material, an inorganic light emitting material, an organic-inorganic light emitting material, a quantum dot, a quantum rod, a micro-LED, or a nano-LED. The encapsulation layer 140 may be disposed on the light emitting element layer 130. The encapsulation layer 140 may protect the light emitting element layer 130 from moisture, oxygen, and foreign substances, such as dust particles.

At least one buffer layer BFL may be formed on an upper surface of the base layer 110. The buffer layer BFL may increase an adhesive force between the base layer 110 and the semiconductor pattern. The buffer layer BFL may be formed in multiple layers. The display layer 100 may further include a barrier layer. The buffer layer BFL may include silicon oxide, silicon nitride, and/or silicon oxynitride. For example, the buffer layer BFL may have a stack structure in which a silicon oxide layer and a silicon nitride layer are alternately stacked with each other.

The semiconductor pattern SC, AL, DR, and SCL may be disposed on the buffer layer BFL. The semiconductor pattern SC, AL, DR, and SCL may include polysilicon, however, it should not necessarily be limited thereto or thereby. The semiconductor pattern SC, AL, DR, and SCL may include amorphous silicon, low temperature polycrystalline silicon, or oxide semiconductor.

FIG. 4A shows a portion of the semiconductor pattern SC, AL, DR, and SCL, and the semiconductor pattern SC, AL, DR, and SCL may be further disposed in other areas. The semiconductor pattern SC, AL, DR, and SCL may be arranged with a specific rule over pixels. The semiconductor pattern SC, AL, DR, and SCL may have different electrical properties depending on whether or not it is doped or whether it is doped with an N-type dopant or a P-type dopant. The semiconductor pattern SC, AL, DR, and SCL may include a first region SC, DR, and SCL having a relatively high conductivity and a second region AL having a relatively low conductivity. The first region SC, DR, and SCL may be doped with the N-type dopant or the P-type dopant. A P-type transistor may include a doped region doped with the P-type dopant, and an N-type transistor may include a doped region doped with the N-type dopant. The second region AL may be a non-doped region or a region doped at a concentration lower than that of the first region SC, DR, and SCL.

The first region SC, DR, and SCL may have a conductivity that is greater than that of the second region AL and may substantially serve as an electrode or signal line. The second region AL may substantially correspond to an active area AL (or a channel) of a transistor 100PC. For example, a portion AL of the semiconductor pattern SC, AL, DR, and SCL may be the active area AL of the transistor 100PC, another portion SC or DR of the semiconductor pattern SC, AL, DR, and SCL may be a source area SC or a drain area DR of the transistor 100PC, and the other portion SCL of the semiconductor pattern SC, AL, DR, and SCL may be a connection electrode or a connection signal line SCL.

FIG. 4A shows one transistor 100PC and one light emitting element 100PE included in each pixel.

The source area SC, the active area AL, and the drain area DR of the transistor 100PC may be formed from the semiconductor pattern SC, AL, DR, and SCL. The source area SC and the drain area DR may extend in opposite directions to each other from the active area AL in a cross-section. FIG. 4A shows a portion of the connection signal line SCL formed from the semiconductor pattern SC, AL, DR, and SCL. The connection signal line SCL may be connected to the drain area DR of the transistor 100PC in a plan view.

A first insulating layer 10 may be disposed on the buffer layer BFL. The first insulating layer 10 may commonly overlap the pixels and may cover the semiconductor pattern SC, AL, DR, and SCL. The first insulating layer 10 may be an inorganic layer and/or an organic layer and may have a single-layer or multi-layer structure. The first insulating layer 10 may include aluminum oxide, titanium oxide, silicon oxide, silicon nitride, silicon oxynitride, zirconium oxide, and/or hafnium oxide. In the present embodiment, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include at least one of the above-mentioned materials, however, it should not necessarily be limited thereto or thereby.

A gate GT of the transistor 100PC may be disposed on the first insulating layer 10. The gate GT may be a portion of a metal pattern. The gate GT may overlap the active area AL. The gate GT may be used as a mask in a process of doping the semiconductor pattern SC, AL, DR, and SCL.

A second insulating layer 20 may be disposed on the first insulating layer 10 and may cover the gate GT. The second insulating layer 20 may commonly overlap the pixels. The second insulating layer 20 may be an inorganic layer and/or an organic layer and may have a single-layer or multi-layer structure. The second insulating layer 20 may include silicon oxide, silicon nitride, and/or silicon oxynitride. In the present embodiment, the second insulating layer 20 may have a multi-layer structure of a silicon oxide layer and a silicon nitride layer.

A third insulating layer 30 may be disposed on the second insulating layer 20. The third insulating layer 30 may have a single-layer or multi-layer structure. As an example, the third insulating layer 30 may have a multi-layer structure of a silicon oxide layer and a silicon nitride layer.

A first connection electrode CNE1 may be disposed on the third insulating layer 30. The first connection electrode CNE1 may be connected to the connection signal line SCL through a contact hole CNT-1 defined through the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include the light emitting element 100PE. As an example, the light emitting element layer 130 may include an organic light emitting material, an inorganic light emitting material, an organic-inorganic light emitting material, a quantum dot, a quantum rod, a micro-LED, or a nano-LED. Hereinafter, the organic light emitting element will be described as the light emitting element 100PE, however, it should not necessarily be particularly limited thereto.

The light emitting element 100PE may include a first electrode AE, a light emitting layer EL, and a second electrode CE.

The first electrode AE may be disposed on the sixth insulating layer 60. The first electrode AE may be connected to the second connection electrode CNE2 through a contact hole CNT-3 defined through the sixth insulating layer 60.

A pixel definition layer 70 may be disposed on the sixth insulating layer 60 and may cover a portion of the first electrode AE. An opening 70-OP may be defined through the pixel definition layer 70. At least a portion of the first electrode AE may be exposed through the opening 70-OP of the pixel definition layer 70.

The display layer 100 may include a light emitting area PXA and a non-light-emitting area NPXA adjacent to the light emitting area PXA. The non-light-emitting area NPXA may at least partially surround the light emitting area PXA. In the present embodiment, the light emitting area PXA may be defined to correspond to the portion of the first electrode AE exposed through the opening 70-OP.

The light emitting layer EL may be disposed on the first electrode AE. The light emitting layer EL may be disposed in an area corresponding to the opening 70-OP. For example, the light emitting layer EL may be formed in each of the pixels after being divided into plural portions. When the light emitting layer EL is formed in each of the pixels after being divided into plural portions, each of the light emitting layers EL may emit blue, red, and/or green light, however, it should not necessarily be limited thereto or thereby. The light emitting layer EL may be integrally formed and may be commonly provided to the pixels. In this case, the light emitting layer EL may provide a blue light or a white light.

The second electrode CE may be disposed on the light emitting layer EL. The second electrode CE may have an integral shape (e.g., a single, continuous structure without interruption) and may be commonly disposed over the pixels.

According to an embodiment, a hole control layer may be disposed between the first electrode AE and the light emitting layer EL. The hole control layer may be commonly disposed in the light emitting area PXA and the non-light-emitting area NPXA. The hole control layer may include a hole transport layer and may further include a hole injection layer. An electron control layer may be disposed between the light emitting layer EL and the second electrode CE. The electron control layer may include an electron transport layer and may further include an electron injection layer.

Each of the hole control layer and the electron control layer may be commonly formed in the plural pixels using an open mask.

The encapsulation layer 140 may be disposed on the light emitting element layer 130. The encapsulation layer 140 may include an inorganic layer, an organic layer, and an inorganic layer, which are sequentially stacked one on another, however, the layers of the encapsulation layer 140 should not necessarily be limited thereto or thereby. The inorganic layers may protect the light emitting element layer 130 from moisture and oxygen, and the organic layer may protect the light emitting element layer 130 from a foreign substance such as dust particles. The inorganic layers may include a silicon nitride layer, a silicon oxynitride layer, a silicon oxide layer, a titanium oxide layer, or an aluminum oxide layer. The organic layer may include an acrylic-based organic layer, however, it should not necessarily be limited thereto or thereby.

The sensor layer 200 may include a base layer 201, a first conductive layer 202, an intermediate insulating layer 203, a second conductive layer 204, and a cover insulating layer 205.

The base layer 201 may be an inorganic layer including silicon nitride, silicon oxynitride, and/or silicon oxide. As another way, the base layer 201 may be an organic layer including an epoxy-based resin, an acrylic-based resin, or an imide-based resin. The base layer 201 may have a single-layer structure or a multi-layer structure of layers stacked in the third direction DR3.

Each of the first conductive layer 202 and the second conductive layer 204 may have a single-layer structure or a multi-layer structure of layers stacked in the third direction DR3.

Each of the first and second conductive layers 202 and 204 having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include conductive polymer such as poly(3,4-ethylenedioxythiophene) (PEDOT), metal nanowire, graphene, or the like.

Each of the first and second conductive layers 202 and 204 having the multi-layer structure may include metal layers. The metal layers may have a three-layer structure of titanium/aluminum/titanium. The conductive layer having the multi-layer structure may include at least one metal layer and at least one transparent conductive layer.

The intermediate insulating layer 203 and/or the cover insulating layer 205 may include an inorganic layer. The inorganic layer may include aluminum oxide, titanium oxide, silicon oxide, silicon nitride, silicon oxynitride, zirconium oxide, and/or hafnium oxide.

The intermediate insulating layer 203 and/or the cover insulating layer 205 may include an organic layer. The organic layer may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

Figure 4B:
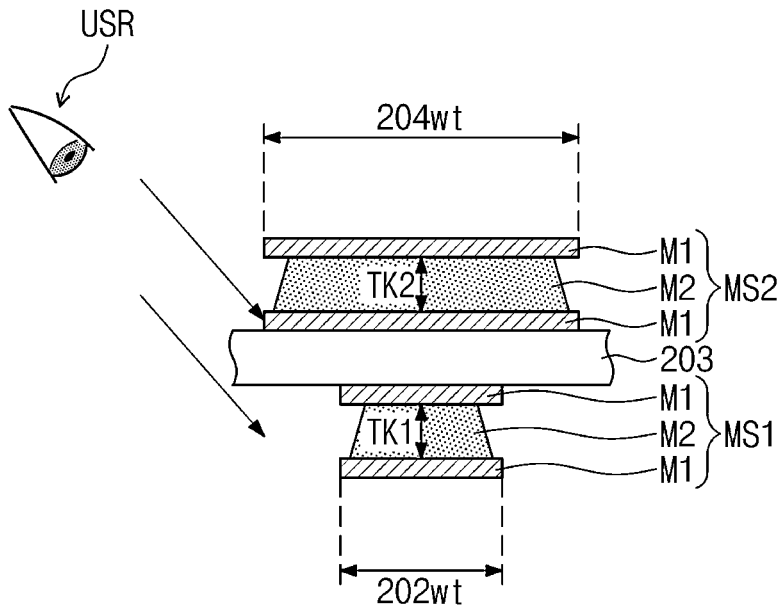
FIG. 4B is a cross-sectional view of a sensor layer according to an embodiment of the present disclosure.

FIG. 4B is a cross-sectional view of the sensor layer 200 (refer to FIG. 4A) according to an embodiment of the present disclosure.

Referring to FIGS. 4A and 4B, a second mesh line MS2 included in the second conductive layer 204 may have a second width 204wt that is equal to or greater than a first width 202wt of a first mesh line MS1 included in the first conductive layer 202. When a user USR looks at the first mesh line MS1 and the second mesh line MS2 from the side of the sensor layer 200, a probability of the user USR recognizing the first mesh line MS1 may be reduced since the width of the first mesh line MS1 is smaller than that of the second mesh line MS2.

Each of the first mesh line MS1 and the second mesh line MS2 may include first metal layers M1 and a second metal layer M2 disposed between the first metal layers M1. As an example, the first metal layers M1 may include titanium (Ti), and the second metal layer M2 may include aluminum (Al), however, this is an example.

According to an embodiment, a first thickness TK1 of the second metal layer M2 of the first mesh line MS1 and a second thickness TK2 of the second metal layer M2 of the second mesh line MS2 may be substantially the same as each other, however, the present disclosure should not necessarily be particularly limited thereto. As an example, the second thickness TK2 may be greater than the first thickness TK1. According to an embodiment, each of the first thickness TK1 and the second thickness TK2 may be about 1000 angstroms or more, e.g., about 6000 angstroms.

Figure 5:
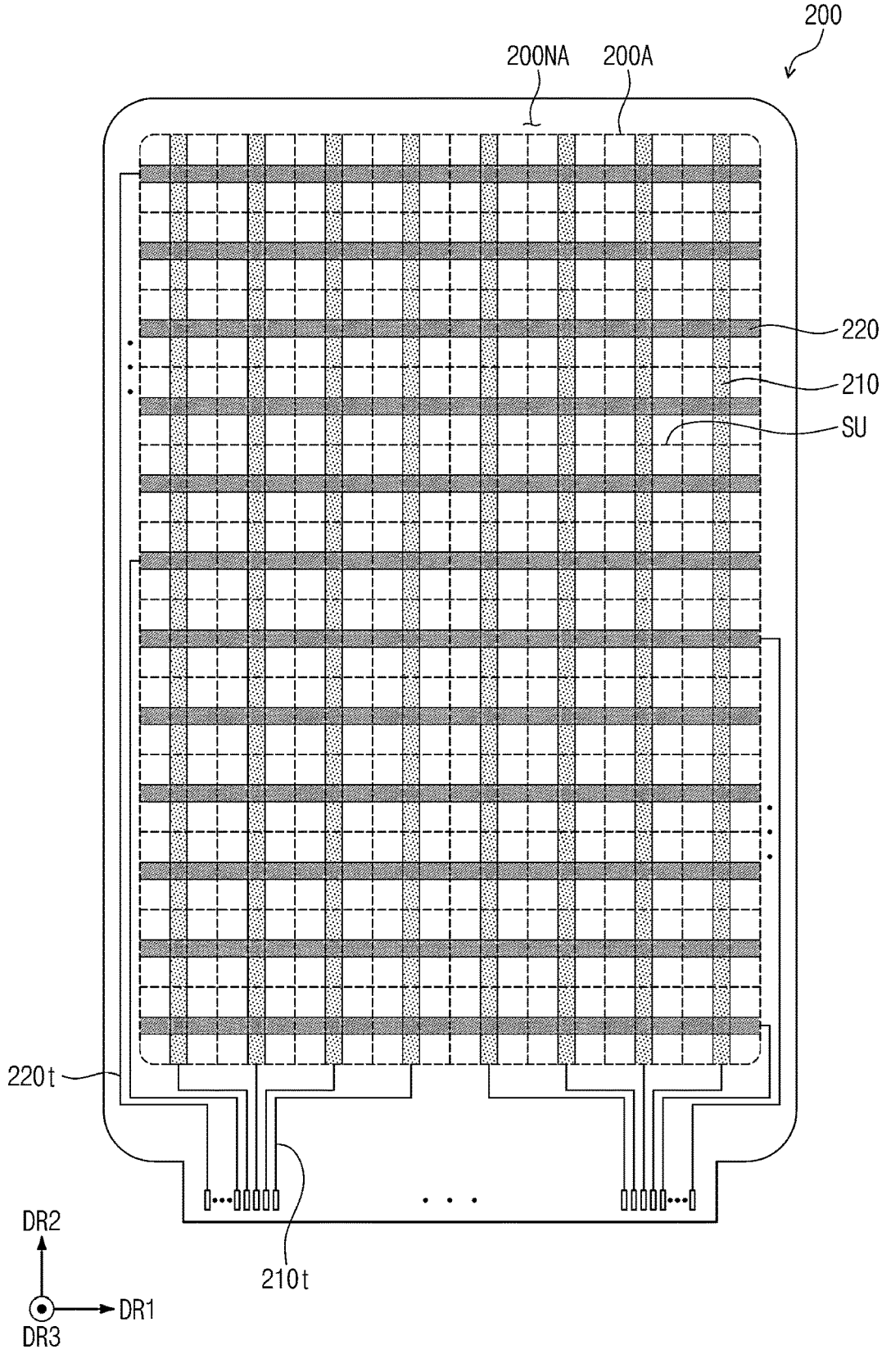
FIG. 5 is a plan view of a sensor layer according to an embodiment of the present disclosure.

FIG. 5 is a plan view of the sensor layer 200 according to an embodiment of the present disclosure.

Referring to FIG. 5, the sensor layer 200 may include a sensing area 200A and a peripheral area 200NA adjacent to the sensing area 200A, which are defined therein.

The sensor layer 200 may include a plurality of first electrodes 210 and a plurality of second electrodes 220, which are arranged in the sensing area 200A. The first electrodes 210 may be arranged in the first direction DR1, and the second electrodes 220 may be arranged in the second direction DR2 intersecting the first direction DR1. Each of the first electrodes 210 may extend in the second direction DR2, and each of the first electrodes 210 may intersect the second electrodes 220. Each of the second electrodes 220 may extend in the first direction DR1, and each of the second electrodes 220 may intersect the first electrodes 210.

FIG. 5 shows eight first electrodes 210 and twelve second electrodes 220 as a representative example, however, the number of each of the first electrodes 210 and the second electrodes 220 should not necessarily be particularly limited thereto. As an example, the number of the first electrodes 210 and the number of the second electrodes 220 may vary depending on a screen ratio of the electronic device 1000 (refer to FIG. 1).

The sensor layer 200 may include a plurality of first trace lines 210t electrically connected to the first electrodes 210, respectively, and a plurality of second trace lines 220t electrically connected to the second electrodes 220, respectively.

According to the present disclosure, the first trace lines 210t and the second trace lines 220t may be arranged in the peripheral area 200NA, however, they should not necessarily be limited thereto or thereby. As an example, the second trace lines 220t may extend and may be arranged in the sensing area 200A. In this case, a size of the peripheral area 200NA may be reduced. As a result, the size occupied by the peripheral area 1000NA (refer to FIG. 1) on a front surface of the electronic device 1000 (refer to FIG. 1) may be reduced, and a narrow bezel may be implemented.

Figure 6:
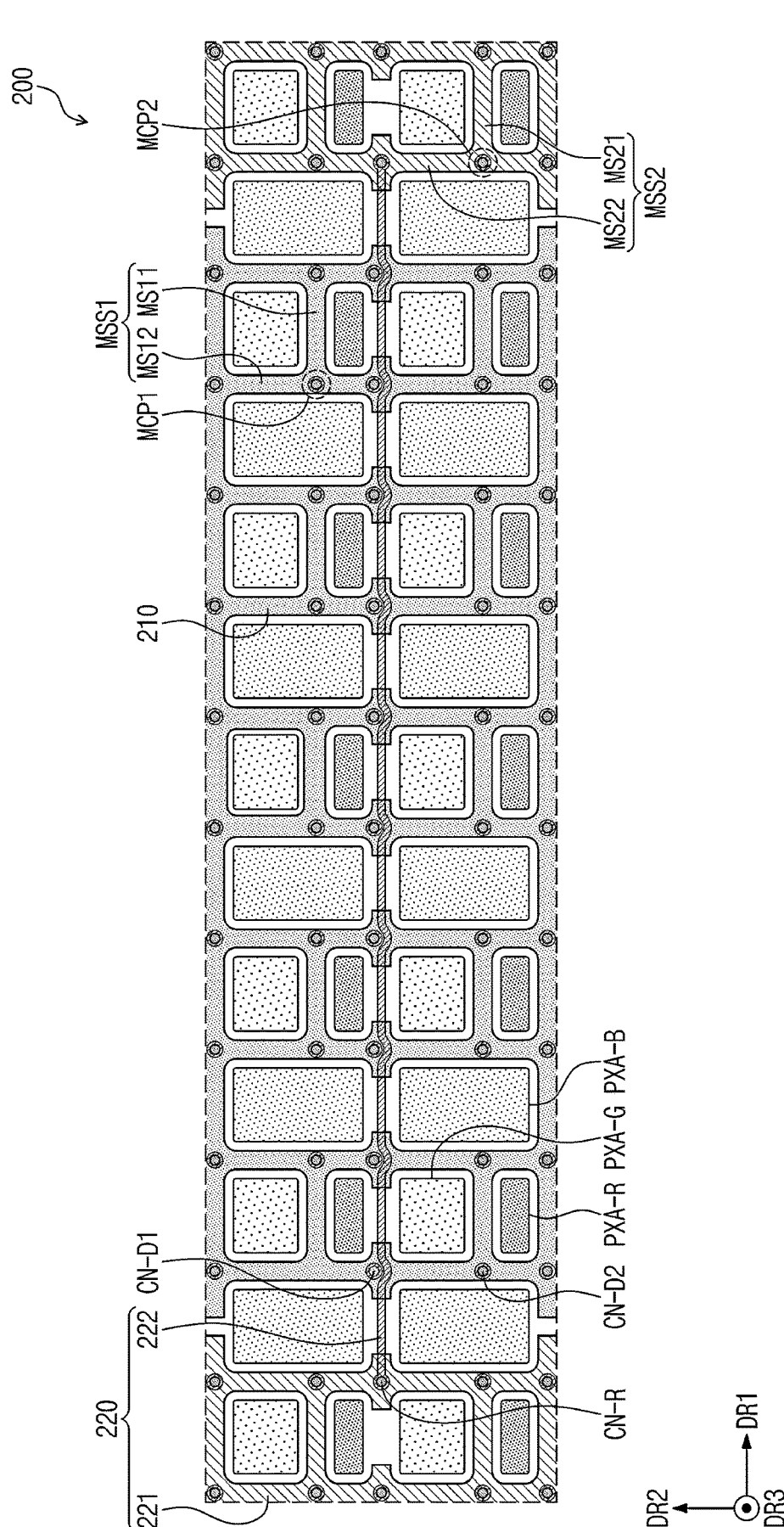
FIG. 6 is an enlarged plan view of a portion of a display panel according to an embodiment of the present disclosure.

FIG. 6 is an enlarged plan view of a portion of the display panel DP according to an embodiment of the present disclosure.

Referring to FIGS. 4A, 5, and 6, the display layer 100 of the display panel DP may include the light emitting area PXA, and the light emitting area PXA may be provided in plural. The light emitting areas PXA may include a first light emitting area PXA-R, a second light emitting area PXA-G, and a third-light emitting area PXA-B. As an example, the first light emitting area PXA-R may be a red light emitting area, the second light emitting area PXA-G may be a green light emitting area, and the third-light emitting area PXA-B may be a blue light emitting area.

One first light emitting area PXA-R and one second light emitting area PXA-G may be alternately and repeatedly arranged with each other in the second direction DR2. The third-light emitting areas PXA-B may be arranged in the second direction DR2. The third-light emitting area PXA-B may be spaced apart from the first and second light emitting areas PXA-R and PXA-G in the first direction DR1. The arrangement relationship between the first, second, and third-light emitting areas PXA-R, PXA-G, and PXA-B shown in FIG. 6 is an example, and the present disclosure should not necessarily be particularly limited thereto.

The first electrodes 210 may have a first mesh structure MSS1. As an example, the first mesh structure MSS1 may include a plurality of first mesh lines MS11 extending in the first direction DR1 and a plurality of second mesh lines MS12 extending in the second direction DR2. A portion where one first mesh line MS11 intersects or meets with one second mesh line MS12 may be referred to as a first cross-point MCP1.

Each of the second electrodes 220 may include sensing patterns 221 and bridge patterns 222 disposed on a different layer from the sensing patterns 221. The sensing patterns 221 may be spaced apart from each other in the first direction DR1, and the bridge patterns 222 may electrically connect the sensing patterns 221 adjacent to each other. Each of the sensing patterns 221 may have a second mesh structure MSS2. As an example, the second mesh structure MSS2 may include a plurality of third mesh lines MS21 extending in the first direction DR1 and a plurality of fourth mesh lines MS22 extending in the second direction DR2. A portion where one third mesh line MS21 intersects or meets with one fourth mesh line MS22 may be referred to as a second cross-point MCP2.

According to an embodiment, the first electrodes 210 and the sensing pattern 221 may be disposed on the same layer. The bridge patterns 222 may be disposed on a different layer from the first electrodes 210 and the sensing pattern 221. As an example, the first electrodes 210 and the sensing pattern 221 may be included in the second conductive layer 204 (refer to FIG. 4A), and the bridge patterns 222 may be included in the first conductive layer 202 (refer to FIG. 4A). In this case, the sensor layer 200 may have a structure in which the bridge patterns 222 are disposed closer to the display layer 100 than the sensing patterns 221 are. Accordingly, the sensor layer 200 may have a bottom bridge structure, however, this is an example, and the present disclosure should not necessarily be limited thereto or thereby. According to an embodiment, the first electrodes 210 and the sensing pattern 221 may be included in the first conductive layer 202 (refer to FIG. 4A), and the bridge patterns 222 may be included in the second conductive layer 204 (refer to FIG. 4A). In this case, the sensor layer 200 may have a top bridge structure.

According to the present embodiment, a plurality of contact holes CN-R, CN-D1, and CN-D2 may be provided (defined or formed) through the sensor layer 200. For example, the contact holes CN-R, CN-D1, and CN-D2 may be formed through the intermediate insulating layer 203 (refer to FIG. 4A). The intermediate insulating layer 203 may be disposed between the first conductive layer 202 (refer to FIG. 4A) and the second conductive layer 204 (refer to FIG. 4A) and may be referred to as an insulating layer.

The contact holes CN-R, CN-D1, and CN-D2 may include an effective contact hole CN-R, a first dummy contact hole CN-D1, and a second dummy contact hole CN-D2. Each of the effective contact hole CN-R, the first dummy contact hole CN-D1, and the second dummy contact hole CN-D2 may be provided to the first cross-point MCP1 or the second cross-point MCP2.

The effective contact hole CN-R may be a point where the sensing pattern 221 is electrically connected to the bridge pattern 222. As an example, the effective contact hole CN-R may be formed through the intermediate insulating layer 203 disposed between the sensing pattern 221 and the bridge pattern 222, and a portion of the bridge pattern 222 may be exposed through the effective contact hole CN-R. The portion of the bridge pattern 222 exposed through the effective contact hole CN-R may be electrically connected to the sensing pattern 221.

The effective contact hole CN-R may overlap the bridge pattern 222. The bridge pattern 222 may be electrically connected to two sensing patterns 221 spaced apart from each other through the effective contact holes CN-R. For example, the effective contact hole CN-R may be provided to transmit signals, and signals provided to a conductive pattern included in the second conductive layer 204 (refer to FIG. 4A) may be transmitted to a conductive pattern included in the first conductive layer 202 (refer to FIG. 4A) through the effective contact hole CN-R. The first dummy contact hole CN-D1 and the second dummy contact hole CN-D2 might not be connected to the bridge pattern 222 and might not overlap the bridge pattern 222.

The entire first and second cross-points MCP1 and MCP2 defined in the first and second mesh structures MSS1 and MSS2 may overlap the effective contact hole CN-R, the first dummy contact hole CN-D1, or the second dummy contact hole CN-D2 in a one-to-one correspondence. In this case, the arrangement of the contact holes CN-R, CN-D1, and CN-D2 in the sensor layer 200 may be substantially uniform. As a result, a variation in an amount of reflection of an external light depending on the presence or absence of the effective contact holes CN-R in the sensor layer 200 may be reduced. Accordingly, pattern visibility, where a specific pattern is visible due to deviation in the amount of reflection, is reduced, and thus visibility of the electronic device 1000 (refer to FIG. 1) may be increased. Increasing the visibility of an electronic device 1000 may mean that patterns unnecessary for viewing images, such as contact holes, are not visible.

Figure 7:
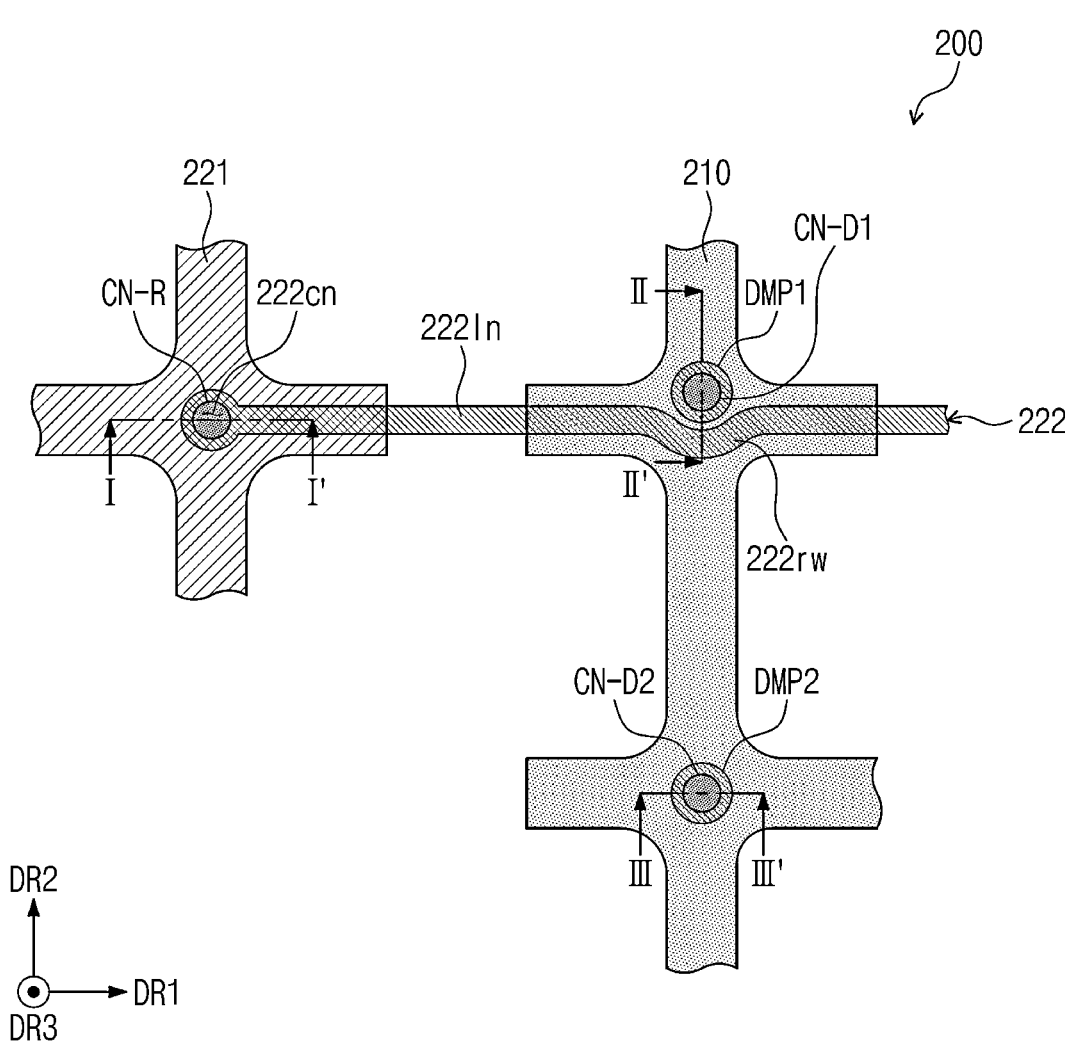
FIG. 7 is an enlarged plan view of a portion of a sensor layer according to an embodiment of the present disclosure.
Figure 8:
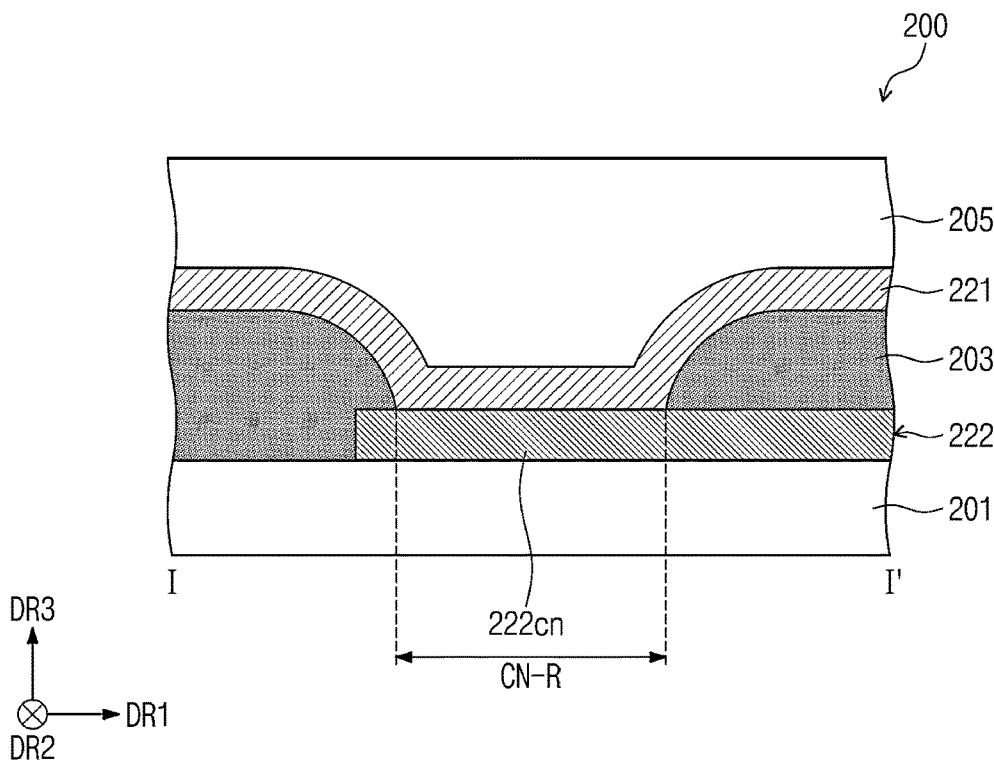
FIG. 8 is a cross-sectional view of a sensor layer according to an embodiment of the present disclosure.
Figure 9:
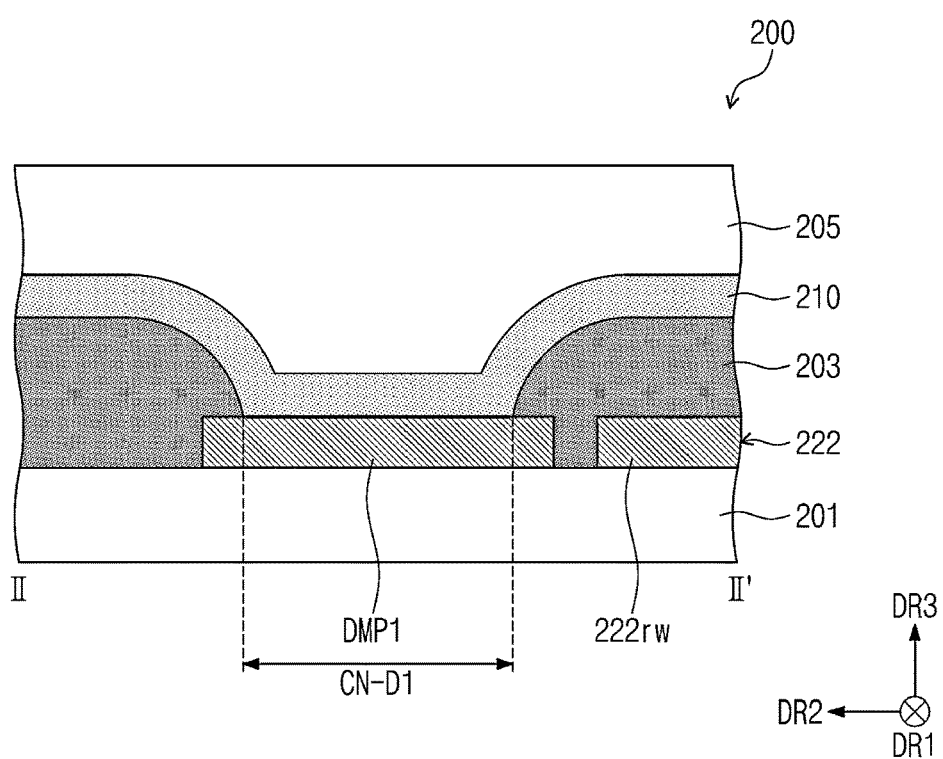
FIG. 9 is a cross-sectional view of a sensor layer according to an embodiment of the present disclosure.
Figure 10:
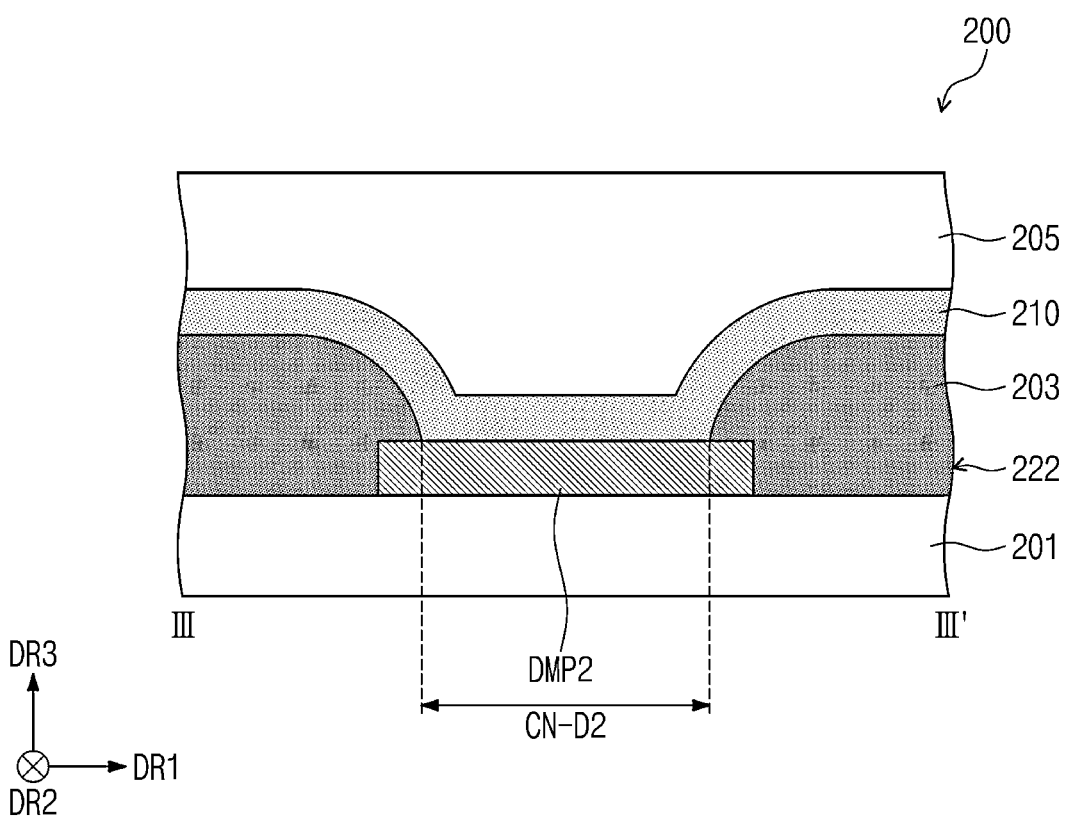
FIG. 10 is a cross-sectional view of a sensor layer according to an embodiment of the present disclosure.

FIG. 7 is an enlarged plan view of a portion of the sensor layer 200 according to an embodiment of the present disclosure. FIG. 8 is a cross-sectional view of the sensor layer 200 according to an embodiment of the present disclosure. For example, FIG. 8 is a cross-sectional view taken along a line I-I' shown in FIG. 7. FIG. 9 is a cross-sectional view of the sensor layer 200 according to an embodiment of the present disclosure. FIG. 9 is a cross-sectional view taken along a line II-II' shown in FIG. 7. FIG. 10 is a cross-sectional view of the sensor layer 200 according to an embodiment of the present disclosure. FIG. 10 is a cross-sectional view taken along a line III-III' shown in FIG. 7.

Referring to FIGS. 7 to 10, the sensor layer 200 may further include a first dummy pattern DMP1 overlapping the first dummy contact hole CN-D1 and a second dummy pattern DMP2 overlapping the second dummy contact hole CN-D2. The first dummy pattern DMP1 and the second dummy pattern DMP2 may be disposed on the same layer as the bridge pattern 222.

The first dummy pattern DMP1 and the second dummy pattern DMP2 may be spaced apart from the bridge pattern 222. The bridge pattern 222 may extend in the first direction DR1, and the first dummy pattern DMP1 and the second dummy pattern DMP2 may be spaced apart from the bridge pattern 222 in the second direction DR2 intersecting the first direction DR1.

The bridge pattern 222 may include a connection portion 222cn overlapping the effective contact hole CN-R, a line portion 222ln extending from the connection portion 222cn to the first direction DR1, and a curved portion 222rw extending from the line portion 2221n and curved. The connection portion 222cn may have a width that is greater than a width of the line portion 222ln. The curved portion 222rw may have a curved shape to bypass the first dummy pattern DMP1. For example, the first dummy pattern DMP1 may be spaced apart from the curved portion 222rw in the second direction DR2.

According to an embodiment, the bridge pattern 222 may be connected to the sensing pattern 221 in the effective contact hole CN-R. The first dummy pattern DMP1 may be connected to the first electrode 210 in the first dummy contact hole CN-D1, and the second dummy pattern DMP2 may be connected to the first electrode 210 in the second dummy contact hole CN-D2. For example, patterns respectively included in the two conductive layers, for example, the conductive pattern included in the first conductive layer 202 (refer to FIG. 4A) and the conductive pattern included in the second conductive layer 204 (refer to FIG. 4A), may be connected to each other in each of the contact holes CN-R, CN-D1, and CN-D2. The first and second dummy patterns DMP1 and DMP2, which are electrically connected to the first electrode 210, may be referred to as first and second auxiliary patterns.

As the first and second dummy patterns DMP1 and DMP2 overlapping the first and second dummy contact holes CN-D1 and CN-D2 and having a floating shape are provided, a cross-sectional structure in which the effective contact hole CN-R is defined and a cross-sectional structure in which the first and second dummy contact holes CN-D1 and CN-D2 are defined may have a similar shape to each other. Accordingly, a difference in the amount of reflection of the external light between the effective contact hole CN-R and the first and second dummy contact holes CN-D1 and CN-D2 may be reduced. Accordingly, the electronic device 1000 (refer to FIG. 1) with increased visibility by reducing visibility of patterns due to reflection of external light.

Figure 11:
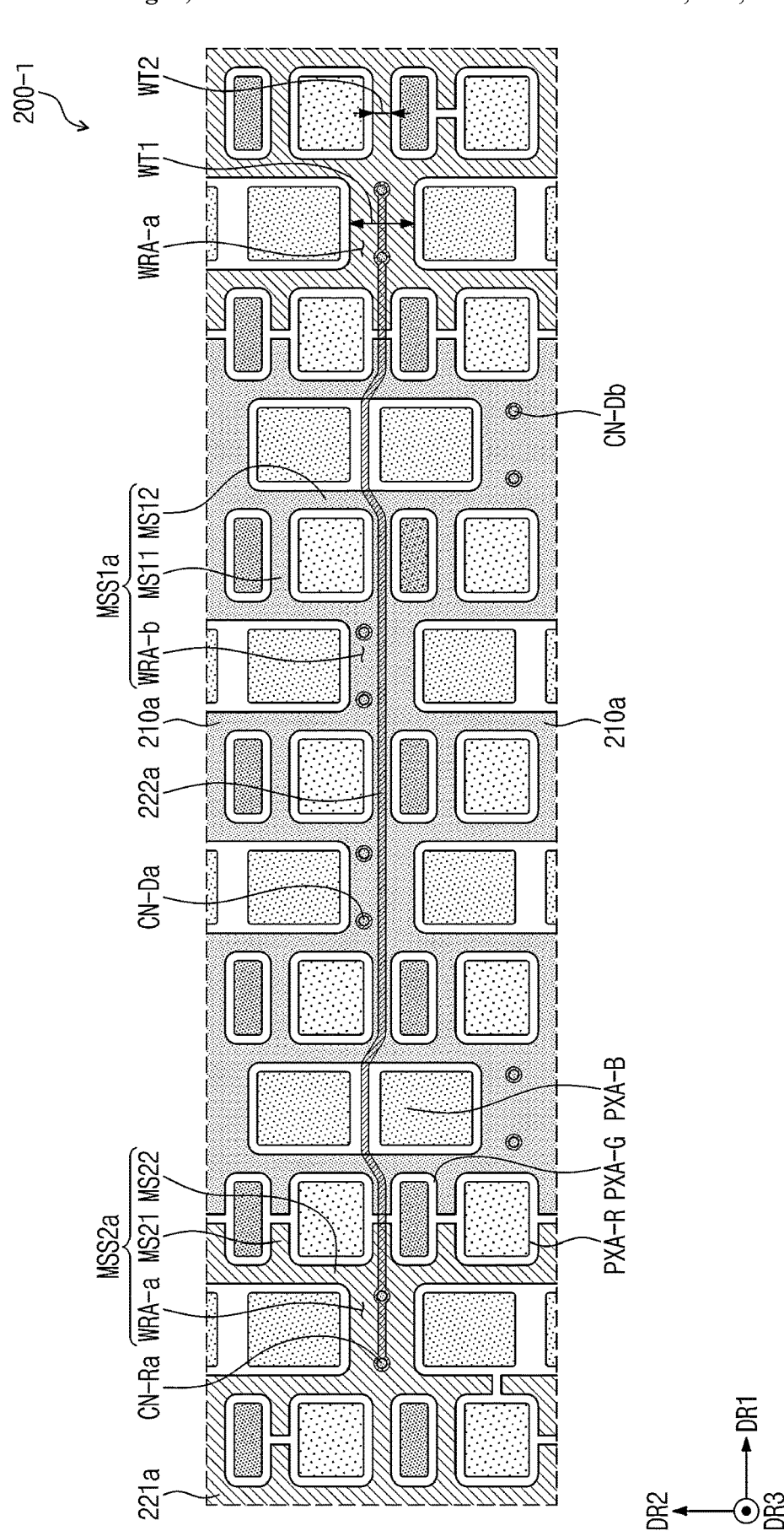
FIG. 11 is an enlarged plan view of a portion of a display panel according to an embodiment of the present disclosure.

FIG. 11 is an enlarged plan view of a portion of a display panel according to an embodiment of the present disclosure. FIG. 12 is an enlarged plan view of a portion of a sensor layer 200-1 according to an embodiment of the present disclosure.

Referring to FIGS. 4A, 5, 11, and 12, first electrodes 210a may have a first mesh structure MSS1a. As an example, the first mesh structure MSS1a may include a plurality of first mesh lines MS11 extending in the first direction DR1, a plurality of second mesh lines MS12 extending in the second direction DR2, and a first non-opening area WRA-b.

Each of sensing patterns 221a may have a second mesh structure MSS2a. As an example, the second mesh structure MSS2a may include a plurality of third mesh lines MS21 extending in the first direction DR1, a plurality of fourth mesh lines MS22 extending in the second direction DR2, and a second non-opening area WRA-a.

Each of the first non-opening area WRA-b and the second non-opening area WRA-a may have a width WT1 that is greater than a width WT2 of the mesh lines. As an example, the width WT1 of the second non-opening area WRA-a may be greater than the width WT2 of the third mesh line MS21. In addition, the width of the first non-opening area WRA-b may be greater than the width of the first mesh line MS11.

According to an embodiment, the second non-opening area WRA-a may be defined between two third-light emitting areas PXA-B adjacent to each other in the second direction DR2 among third-light emitting areas PXA-B. A bridge pattern 222a may overlap an area between the two third-light emitting areas PXA-B adjacent to each other. In this case, effective contact holes CN-Ra may be provided to overlap the second non-opening area WRA-a.

The first non-opening area WRA-b may be defined between other two third-light emitting areas PXA-B adjacent to each other in the second direction DR2 among the third-light emitting areas PXA-B. A plurality of dummy contact holes CN-Da may overlap an area between the other two third-light emitting areas PXA-B adjacent to each other, i.e., the first non-opening area WRA-b.

According to an embodiment, the sensor layer 200-1 may further include a plurality of dummy patterns DMPa overlapping the dummy contact holes CN-Da and spaced apart from the bridge pattern 222a. The dummy patterns DMPa may overlap the dummy contact holes CN-Da in a one-to-one correspondence. Accordingly, the dummy patterns DMPa may also overlap the first non-opening area WRA-b.

Each of the non-opening areas WRA-a and WRA-b may overlap at least one effective contact hole of the effective contact holes CN-Ra or at least one dummy contact hole of the dummy contact holes CN-Da. In this case, the arrangement of the contact holes CN-Ra and CN-Da of the sensor layer 200-1 may be substantially uniform. As a result, the difference in the amount of reflection of the external light depending on the presence or absence of the effective contact holes CN-Ra in the sensor layer 200-1 may be reduced. Accordingly, the electronic device 1000 (refer to FIG. 1) with increased visibility by reducing visibility of patterns due to reflection of external light.

FIG. 13 is an enlarged plan view of a portion of a sensor layer 200-2 according to an embodiment of the present disclosure.

Referring to FIG. 13, a bridge pattern 222a-1 may include a connection portion 222cn overlapping an effective contact hole CN-Ra, a line portion 222ln extending from the connection portion 222cn in the first direction DR1, and a curved portion 222a-rw extending from the line portion 222ln and curved. The curved portion 222a-rw may have a curved shape to bypass dummy patterns DMPa. For example, the dummy patterns DMPa may be spaced apart from the curved portion 222a-rw in the second direction DR2.

According to an embodiment, the dummy patterns DMPa and dummy contact holes CN-Da may be disposed closer to the curved portion 222a-rw compared with the structure shown in FIG. 13. In this case, the effective contact hole CN-Ra and the dummy contact hole CN-Da may be aligned with each other.

FIG. 14 is an enlarged plan view of a portion of a sensor layer 200-3 according to an embodiment of the present disclosure.

Referring to FIG. 14, a bridge pattern 222a-2 may include a line portion 2221n extending in the first direction DR1 and a protrusion portion 222a-pt protruded from the line portion 222ln in the second direction DR2. An effective contact hole CN-Ra1 may overlap the protrusion portion 222a-pt, and a sensing pattern 221a may be electrically connected to the bridge pattern 222a-2 through the effective contact hole CN-Ra1.

The effective contact hole CN-Ra1 may be spaced apart from a dummy contact hole CN-Da in the first direction DR1, and the effective contact hole CN-Ra1 and the dummy contact hole CN-Da may be aligned with each other.

FIG. 15 is an enlarged plan view of a portion of a sensor layer 200-4 according to an embodiment of the present disclosure.

Referring to FIG. 15, a bridge pattern 222a-3 may include a line portion 2221n extending in the first direction DR1, a protrusion portion 222a-pt protruded from the line portion 222ln in the second direction DR2, and a curved portion 222a-rw extending from the line portion 222ln and curved. An effective contact hole CN-Ra1 may overlap the protrusion portion 222a-pt, and a sensing pattern 221a may be electrically connected to the bridge pattern 222a-3 through the effective contact hole CN-Ra1. Dummy patterns DMPa may be spaced apart from the curved portion 222a-rw in the second direction DR2.

The effective contact hole CN-Ra1 may be spaced apart from a dummy contact hole CN-Da in the first direction DR1, and the effective contact hole CN-Ra1 and the dummy contact hole CN-Da may be aligned with each other.

Figure 16:
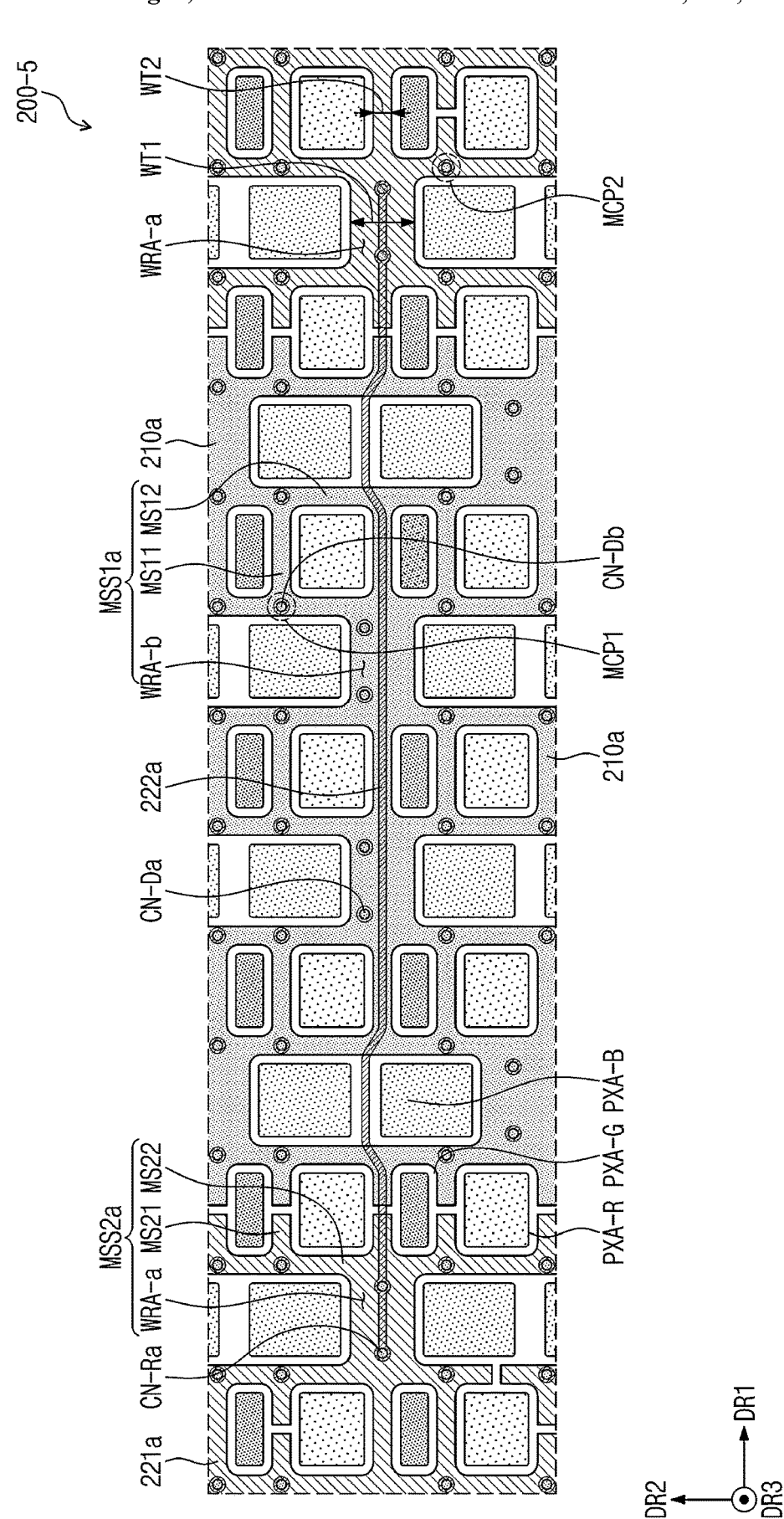
FIG. 16 is an enlarged plan view of a portion of a display panel according to an embodiment of the present disclosure.

FIG. 16 is an enlarged plan view of a portion of a display panel according to an embodiment of the present disclosure.

Referring to FIGS. 4A, 5, 11, and 16, first electrodes 210a of a sensor layer 200-5 may have a first mesh structure MSS1a. As an example, the first mesh structure MSS1a may include a plurality of first mesh lines MS11 extending in the first direction DR1, a plurality of second mesh lines MS12 extending in the second direction DR2, and a first non-opening area WRA-b.

Each of sensing patterns 221a of the sensor layer 200-5 may have a second mesh structure MSS2a. As an example, the second mesh structure MSS2a may include a plurality of third mesh lines MS21 extending in the first direction DR1, a plurality of fourth mesh lines MS22 extending in the second direction DR2, and a second non-opening area WRA-a.

According to the present embodiment, a plurality of contact holes CN-Ra, CN-Da, and CN-Db may be defined through the sensor layer 200-5. The contact holes CN-Ra, CN-Da, and CN-Db may be defined through an intermediate insulating layer 203 (refer to FIG. 4A). The contact holes CN-Ra, CN-Da, and CN-Db may include an effective contact hole CN-Ra, a first dummy contact hole CN-Da, and a second dummy contact hole CN-Db.

Each of the first and second non-opening areas WRA-a and WRA-b may overlap at least one effective contact hole of the effective contact holes CN-Ra or at least one first dummy contact hole of the first dummy contact holes CN-Da. In addition, the second dummy contact holes CN-Db may overlap a first cross-point MCP1 and a second cross-point MCP2. In this case, the arrangement of the contact holes CN-Ra, CN-Da, and CN-Db in the sensor layer 200-5 may be substantially uniform. As a result, the difference in the amount of reflection of the external light depending on the presence or absence of the effective contact holes CN-Ra in the sensor layer 200-5 may be reduced. Accordingly, the electronic device 1000 (refer to FIG. 1) with increased visibility by reducing visibility of patterns due to reflection of external light.

Figure 17:
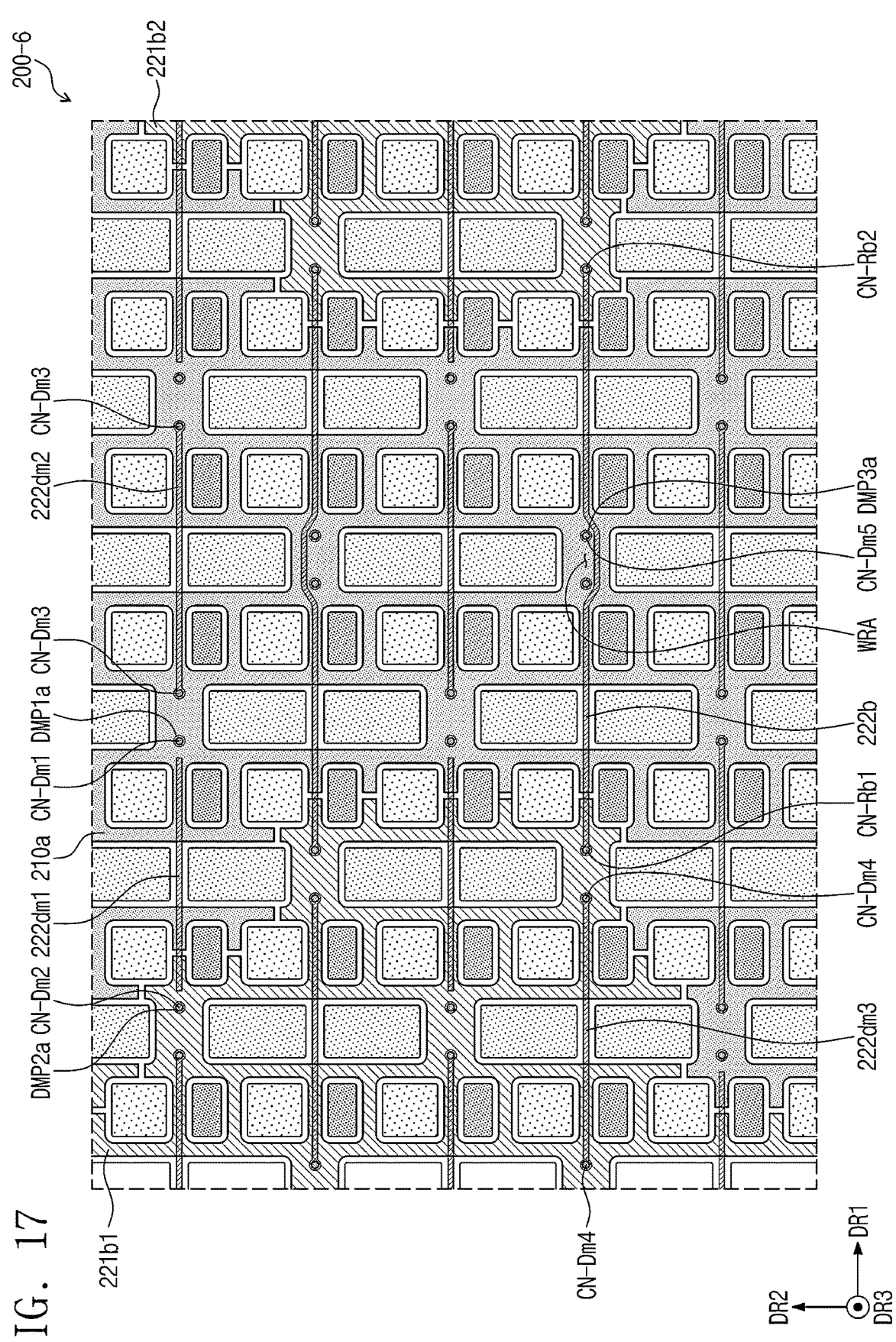
FIG. 17 is an enlarged plan view of a portion of a display panel according to an embodiment of the present disclosure.

FIG. 17 is an enlarged plan view of a portion of a display panel according to an embodiment of the present disclosure.

FIG. 17 shows one sensing pattern 221b1 (hereinafter, referred to as a first sensing pattern) of a second electrode 220, another sensing pattern 221b2 (hereinafter, referred to as a second sensing pattern) of the second electrode 220, and a first electrode 210a as a representative example.

Referring to FIGS. 5 and 17, the first sensing pattern 221b1 and the second sensing pattern 221b2 may be spaced apart from each other with the first electrode 210a interposed therebetween. Accordingly, the first sensing pattern 221b1 and the second sensing pattern 221b2 may be electrically connected to each other by a bridge pattern 222b of the second electrode 220. As an example, the first sensing pattern 221b1 may be connected to the bridge pattern 222b via an effective contact hole CN-Rb1, and the second sensing pattern 221b2 may be connected to the bridge pattern 222b via an effective contact hole CN-Rb2. FIG. 17 shows the structure in which the first sensing pattern 221b1 and the second sensing pattern 221b2 are electrically connected to each other by two bridge patterns 222b as a representative example, however, the present disclosure should not necessarily be limited thereto or thereby.

A sensor layer 200-6 may further include dummy bridge patterns 222dm1, 222dm2, and 222dm3 disposed on the same layer as the bridge patterns 222b. As an example, when only the bridge patterns 222b are disposed, the bridge patterns 222b may be regularly arranged at specific areas where the first electrode 210a intersects the second electrode 220. In this case, the area in which the bridge patterns 222b are disposed and the area in which the bridge patterns 222b are not disposed may exhibit a difference in the amount of reflection. As in the present embodiment, when the dummy bridge patterns 222dm1, 222dm2, and 222dm3 are added at areas other than the specific areas where the first electrode 210a intersects the second electrode 220, the difference in the amount of reflection depending on the presence or absence of the bridge patterns 222b in the sensor layer 200-6 may be reduced by the dummy bridge patterns 222dm1, 222dm2, and 222dm3. Accordingly, the electronic device 1000 (refer to FIG. 1) with increased visibility by reducing visibility of patterns due to reflection of external light.

Each of the dummy bridge patterns 222dm1, 222dm2, and 222dm3 may be electrically floated or may be connected to the same electrode. The dummy bridge patterns 222dm1, 222dm2, and 222dm3 may include a first dummy bridge pattern 222dm1, a second dummy bridge pattern 222dm2, and a third dummy bridge pattern 222dm3. The first dummy bridge pattern 222dm1 may overlap both of the first electrode 210a and the second electrode 220. As an example, the first dummy bridge pattern 222dm1 may overlap the first sensing pattern 221b1 and the first electrode 210a. The second dummy bridge pattern 222dm2 may overlap only the first electrode 210a. The third dummy bridge pattern 222dm3 may overlap only the second electrode 220.

The sensor layer 200-6 may further include a first dummy pattern DMP1a and a second dummy pattern DMP2a, which are disposed on the same layer as the first dummy bridge pattern 222dm1. The first electrode 210a may be connected to the first dummy pattern DMP1a via a first dummy contact hole CN-Dm1, and the first sensing pattern 221b1 may be connected to the second dummy pattern DMP2a via a second dummy contact hole CN-Dm2. The first dummy pattern DMP1a and the second dummy pattern DMP2a may be spaced apart from each other with the first dummy bridge pattern 222dm1 interposed therebetween. In addition, the first dummy contact hole CN-Dm1 and the second dummy contact hole CN-Dm2 might not overlap the first dummy bridge pattern 222dm1. Accordingly, the first dummy bridge pattern 222dm1 may be electrically floated.

The first electrode 210a may be connected to both ends of the second dummy bridge pattern 222dm2 via third dummy contact holes CN-Dm3. Accordingly, the second dummy bridge pattern 222dm2 may be electrically connected to the first electrode 210a. Since the second dummy bridge pattern 222dm2 is electrically connected to the first electrode 210a, the second dummy bridge pattern 222dm2 may be referred to as an auxiliary bridge or an auxiliary pattern.

The first sensing pattern 221b1 may be connected to both ends of the third dummy bridge pattern 222dm3 via fourth dummy contact holes CN-Dm4. Accordingly, the third dummy bridge pattern 222dm3 may be electrically connected to the second electrode 220. Since the third dummy bridge pattern 222dm3 is electrically connected to the second electrode 220, the third dummy bridge pattern 222dm3 may be referred to as an auxiliary bridge or an auxiliary pattern.

According to the present embodiment, fifth dummy contact holes CN-Dm5 may be further defined through the sensor layer 200-6, and the sensor layer 200-6 may further include third dummy patterns DMP3a disposed respectively corresponding to the fifth dummy contact holes CN-Dm5. The third dummy patterns DMP3a may be disposed on the same layer as the bridge patterns 222b and may be spaced apart from the bridge patterns 222b. For example, the third dummy patterns DMP3a may be insulated from the bridge patterns 222b.

The first electrode 210a may be connected to the third dummy patterns DMP3a via the fifth dummy contact holes CN-Dm5. Particularly, a portion of the third dummy patterns DMP3a may be adjacent to the bridge pattern 222b. Therefore, the bridge pattern 222b may have a curved portion bypassing the third dummy patterns DMP3a. For example, the fifth dummy contact holes CN-Dm5 may also be provided in a non-opening area WRA overlapping the bridge pattern 222b.

The fifth dummy contact holes CN-Dm5 may be spaced apart from the effective contact holes CN-Rb1 and CN-Rb2 in the first direction DR1. Since the bridge pattern 222b includes the curved portion, the fifth dummy contact holes CN-Dm5 may be placed at positions aligned with the effective contact holes CN-Rb1 and CN-Rb2 in the first direction DR1.

The shape of the bridge pattern 222b and the arrangement of the fifth dummy contact holes CN-Dm5 should not necessarily be particularly limited to the structure shown in FIG. 17. As an example, the shape of the bridge pattern 222b or the arrangement of the fifth dummy contact holes CN-Dm5 may be changed to the shape or the arrangement shown in FIG. 12, 13, 14, or 15, respectively, or various embodiments described above may be combined in various ways.

According to an embodiment, at least two contact holes may be defined in each of the non-opening areas WRA of the sensor layer 200-6. One of the two contact holes may be the effective contact hole CN-Rb1 or CN-Rb2, and the other of the two contact holes may be the dummy contact hole CN-Dm4 or CN-Dm5. According to an embodiment, both of the two contact holes may be the dummy contact hole CN-Dm1, CN-Dm2, CN-Dm4, or CN-Dm5. According to an embodiment, both of the two contact holes may be the effective contact holes CN-Ra. In this case, an arrangement of the contact holes may be substantially uniform in the sensor layer 200-6. As a result, the difference in the amount of refection of the external light depending on the presence or absence in the effective contact holes CN-Rb1 and CN-Rb2 of the sensor layer 200-6 may be reduced. Accordingly, the electronic device 1000 (refer to FIG. 1) with increased visibility by reducing visibility of patterns due to reflection of external light.

Although embodiments of the present disclosure have been described herein, it is understood that the present disclosure should not necessarily be limited to these embodiments but various changes and modifications can be made by one ordinary skilled in the art within the spirit and scope of the present disclosure. Therefore, the disclosed subject matter should not necessarily be limited to any single embodiment described herein.

What is claimed is:

1. An electronic device, comprising:
a display layer configured to display an image; and
a sensor layer disposed on the display layer, the sensor layer comprising:
a first electrode;
a second electrode intersecting the first electrode and comprising a sensing pattern and a bridge pattern;
an insulating layer disposed between the sensing pattern and the bridge pattern; and
a plurality of dummy patterns disposed on a same layer as the bridge pattern, spaced apart from the bridge pattern, and spaced apart from one another,
wherein a plurality of contact holes is defined through the insulating layer,
wherein the plurality of contact holes comprise a plurality of effective contact holes through which a portion of the bridge pattern is exposed and a plurality of dummy contact holes through which a portion of each of the plurality of dummy patterns is exposed,
wherein each of the plurality of dummy contact holes exposes a different and independent one of the plurality of dummy patterns on a one-to-one basis,
wherein the sensing pattern is electrically connected to the bridge pattern via the effective contact holes, and
wherein the first electrode or the sensing pattern is connected to the dummy patterns via the dummy contact holes.

2. The electronic device of claim 1, wherein the first electrode comprises a first mesh line extending in a first direction and a second mesh line extending in a second direction intersecting the first direction, and
wherein the sensing pattern comprises a third mesh line extending in the first direction and a fourth mesh line extending in the second direction.

3. The electronic device of claim 2,
wherein the plurality of dummy contact holes are defined at a first cross-point where the first mesh line intersects or meets with the second mesh line and a second cross-point where the third mesh line intersects or meets with the fourth mesh line, and
wherein the effective contact holes overlaps the bridge pattern, where the third mesh line intersects or meets with the fourth mesh line.

4. The electronic device of claim 2, wherein the first electrode further comprises a first non-opening area having a width that is greater than a width of the first mesh line, and wherein the sensing pattern further comprises a second non-opening area having a width that is greater than a width of the third mesh line.

5. The electronic device of claim 4, wherein the effective contact holes overlaps the second non-opening area.

6. The electronic device of claim 4,
wherein the plurality of dummy contact holes overlap the first non-opening area.

7. The electronic device of claim 4,
wherein the plurality of dummy contact holes are defined at a first cross-point where the first mesh line intersects or meets the second mesh line, a second cross-point where the third mesh line intersects or meets the fourth mesh line, and the first non-opening area.

8. The electronic device of claim 2, wherein the display layer comprises a plurality of first light emitting areas, a plurality of second light emitting areas, and a plurality of third-light emitting areas,
wherein the plurality of first light emitting areas are alternately arranged with the plurality of second light emitting areas in the second direction,
wherein the plurality of third-light emitting areas are arranged in the second direction, and
wherein one third-light emitting area, among the plurality of third-light emitting areas, is spaced apart from one first light emitting area, among the plurality of first light emitting areas, and one second light emitting area, among the plurality of second light emitting areas, in the first direction.

9. The electronic device of claim 8, wherein the effective contact holes are defined between two third-light emitting areas adjacent to each other in the second direction among the plurality of third-light emitting areas, and
wherein the bridge pattern overlaps an area between the two third-light emitting areas.

10. The electronic device of claim 9, wherein the dummy contact holes are defined between another two third-light emitting areas adjacent to each other in the second direction, among the plurality of third-light emitting areas, and
wherein the dummy patterns overlap an area between the other two third-light emitting areas.

11. The electronic device of claim 1, wherein the bridge pattern extends in a first direction, and
wherein the dummy patterns are spaced apart from the bridge pattern in a second direction intersecting the first direction.

12. The electronic device of claim 11, wherein the bridge pattern comprises a curved portion facing the dummy patterns and curved to bypass the dummy patterns.

13. The electronic device of claim 11, wherein the effective contact holes are spaced apart from the dummy contact holes in the first direction, and
wherein the effective contact holes and the dummy contact holes are aligned with each other.

14. The electronic device of claim 1, wherein the bridge pattern comprises a line portion extending in a first direction, and
wherein the dummy contact holes are spaced apart from the bridge pattern in a second direction intersecting the first direction.

15. The electronic device of claim 14, wherein the bridge pattern further comprises a curved portion extending from the line portion, and
wherein the dummy contact holes are spaced apart from the curved portion in the second direction.

16. The electronic device of claim 14, wherein the bridge pattern further comprises a connection portion connected to the line portion, and wherein the effective contact holes overlaps the connection portion.

17. The electronic device of claim 14, wherein the bridge pattern further comprises a protrusion portion protruded in the second direction, and wherein the effective contact holes overlaps the protrusion portion.

18. The electronic device of claim 1, wherein the sensor layer further comprises a plurality of dummy bridge patterns disposed on a same layer as the bridge pattern and spaced apart from the bridge pattern.

19. The electronic device of claim 18, wherein the plurality of dummy bridge patterns comprises:

a first dummy bridge pattern overlapping the first electrode and the sensing pattern and electrically floated;

a second dummy bridge pattern overlapping the first electrode and electrically connected to the first electrode; and a third dummy bridge pattern overlapping the sensing pattern and electrically connected to the sensing pattern.

20. An electronic device, comprising:

a display layer configured to display an image; and a sensor layer disposed on the display layer, the sensor layer comprising:

a first electrode;

a second electrode intersecting the first electrode and comprising a sensing pattern and a bridge pattern;

an insulating layer disposed between the sensing pattern and the bridge pattern; and a plurality of dummy patterns disposed on a same layer as the bridge pattern, spaced apart from the bridge pattern, and spaced apart from one another, wherein a plurality of contact holes is defined through the insulating layer, wherein the plurality of contact holes comprise a plurality of effective contact holes overlapping the bridge pattern and a plurality of dummy contact holes that do not overlap the bridge pattern and instead overlap the plurality of dummy patterns, wherein each of the plurality of dummy contact holes exposes a different and independent one of the plurality of dummy patterns on a one-to-one basis, wherein the bridge pattern comprises a line portion extending in a first direction, and wherein the dummy contact holes are spaced apart from the bridge pattern in a second direction intersecting the first direction.

21. The electronic device of claim 20, wherein the bridge pattern further comprises a curved portion extending from the line portion, and wherein the dummy contact holes are spaced apart from the curved portion in the second direction.

22. The electronic device of claim 20, wherein the bridge pattern further comprises a connection portion connected to the line portion, and wherein the effective contact holes overlaps the connection portion.

23. The electronic device of claim 20, wherein the bridge pattern further comprises a protrusion portion protruded in the second direction, and wherein the effective contact holes overlaps the protrusion portion.

24. An electronic device, comprising:

a first conductive layer comprising a bridge pattern and a plurality of dummy patterns;

a second conductive layer comprising a plurality of conductive patterns having a mesh structure; and an insulating layer disposed between the first conductive layer and the second conductive layer and provided with a plurality of effective contact holes and a plurality of dummy contact holes defined therethrough, wherein the plurality of effective contact holes overlap the bridge pattern, wherein the plurality of dummy contact holes respectively overlap the plurality of dummy patterns, and wherein each of the plurality of dummy contact holes exposes a different and independent one of the plurality of dummy patterns on a one-to-one basis.

25. The electronic device of claim 24, wherein the mesh structure comprises a plurality of cross-points, and each of the plurality of cross-points overlaps at least one contact hole among the plurality of effective contact holes and the plurality of dummy contact holes.

26. The electronic device of claim 24, wherein the mesh structure comprises a plurality of mesh lines and a plurality of non-opening areas having a width that is greater than a width of the mesh lines, and wherein each of the non-opening areas overlaps at least one effective contact hole among the effective contact holes or at least one dummy contact hole among the dummy contact holes.

27. The electronic device of claim 24, wherein the bridge pattern comprises a line portion extending in a first direction, and wherein the plurality of dummy contact holes are spaced apart from the bridge pattern in a second direction intersecting the first direction.

28. The electronic device of claim 27, wherein the bridge pattern further comprises a plurality of curved portions extending from the line portion, and wherein the plurality of dummy contact holes are spaced apart from the plurality of curved portions in the second direction.

29. The electronic device of claim 27, wherein the bridge pattern further comprises a plurality of connection portions having a width that is greater than a width of the line portion, and wherein the plurality of effective contact holes overlap the plurality of connection portions, respectively.

30. The electronic device of claim 27, wherein the bridge pattern further comprises a plurality of protrusion portions protruded in the second direction, and wherein the plurality of effective contact holes overlap the plurality of protrusion portions.

* * * * *